United States Patent
Teshigahara et al.

[11] Patent Number: 6,150,697
[45] Date of Patent: Nov. 21, 2000

[54] SEMICONDUCTOR APPARATUS HAVING HIGH WITHSTAND VOLTAGE

[75] Inventors: Akihiko Teshigahara, Nisshin; Akiyoshi Asai, Aichi-gun; Kunihiro Onoda, Nagoya; Hiroyasu Itou; Ryuichirou Abe, both of Nagoya; Toshio Sakakibara, Nishio, all of Japan

[73] Assignee: Denso Corporation, Kariya, Japan

[21] Appl. No.: 09/301,562

[22] Filed: Apr. 29, 1999

[30] Foreign Application Priority Data

Apr. 30, 1998 [JP] Japan ................................. 10-120867
May 20, 1998 [JP] Japan ................................. 10-138322

[51] Int. Cl.⁷ ............................................... H01L 27/01
[52] U.S. Cl. ..................... 257/347; 257/335; 257/336; 257/348
[58] Field of Search ..................... 257/347, 348, 257/335, 336

[56] References Cited

U.S. PATENT DOCUMENTS

| | | |
|---|---|---|
| 5,241,210 | 8/1993 | Nakagawa et al. . |
| 5,294,825 | 3/1994 | Nakagawa et al. . |
| 5,343,067 | 8/1994 | Nakagawa et al. . |
| 5,378,912 | 1/1995 | Pein ........................................ 257/335 |
| 5,378,920 | 1/1995 | Nakagawa et al. . |
| 5,434,444 | 7/1995 | Nakagawa et al. . |
| 5,438,220 | 8/1995 | Nakagawa et al. . |
| 5,449,946 | 9/1995 | Sakakibara et al. . |
| 5,536,961 | 7/1996 | Nakagawa et al. . |
| 5,554,872 | 9/1996 | Baba et al. ................................ 257/342 |
| 5,557,134 | 9/1996 | Sugisaka et al. . |
| 5,592,014 | 1/1997 | Funaki et al. . |
| 5,602,551 | 2/1997 | Fukumoto et al. . |
| 5,640,040 | 6/1997 | Nakagawa et al. . |
| 5,644,157 | 7/1997 | Iida et al. . |
| 5,808,346 | 9/1998 | Ueda ........................................ 257/774 |
| 5,874,768 | 2/1999 | Yamaguchi . |
| 5,981,983 | 11/1999 | Funaki et al. ............................ 257/138 |
| 6,046,476 | 4/2000 | Morishita et al. ....................... 257/347 |
| 6,049,109 | 4/2000 | Omura et al. ............................ 257/347 |
| 6,060,748 | 5/2000 | Uchida et al. ........................... 257/347 |
| 6,060,749 | 5/2000 | Wu ........................................... 257/347 |
| 6,063,652 | 5/2000 | Kim .......................................... 438/155 |
| 6,118,152 | 9/2000 | Yamaguchi . |

FOREIGN PATENT DOCUMENTS

| | | |
|---|---|---|
| 2-148855 | 6/1990 | Japan . |
| 4-18674 | 7/1992 | Japan . |
| 404259259 | 9/1992 | Japan ...................... 257/347 |
| 405075124 | 3/1993 | Japan ...................... 257/347 |
| 406163895 | 3/1993 | Japan ...................... 257/347 |
| 405283699 | 10/1993 | Japan ...................... 257/347 |
| 6-151576 | 5/1994 | Japan . |
| 7-147319 | 6/1995 | Japan . |
| 8-064690 | 3/1996 | Japan . |
| 8-306893 | 11/1996 | Japan . |
| 9-045909 | 2/1997 | Japan . |
| 10-189950 | 7/1998 | Japan . |

*Primary Examiner*—David Hardy
*Assistant Examiner*—Edgardo Ortiz
*Attorney, Agent, or Firm*—Pillsbury Madison & Sutro LLP

[57] ABSTRACT

An island region surrounded by a trench is provided in an SOI substrate. The island region is further surrounded by a buffer region with a buffer region contact layer. In the island region, a source region is annularly provided around a drain region, and source and drain electrodes are respectively provided on the source and the drain regions. An annular auxiliary electrode is formed with the source electrode to extend over the trench. Accordingly, a voltage applied to the source electrode can be applied to the auxiliary electrode, so that electric field concentration between the buffer region and the source electrode is relaxed.

21 Claims, 18 Drawing Sheets

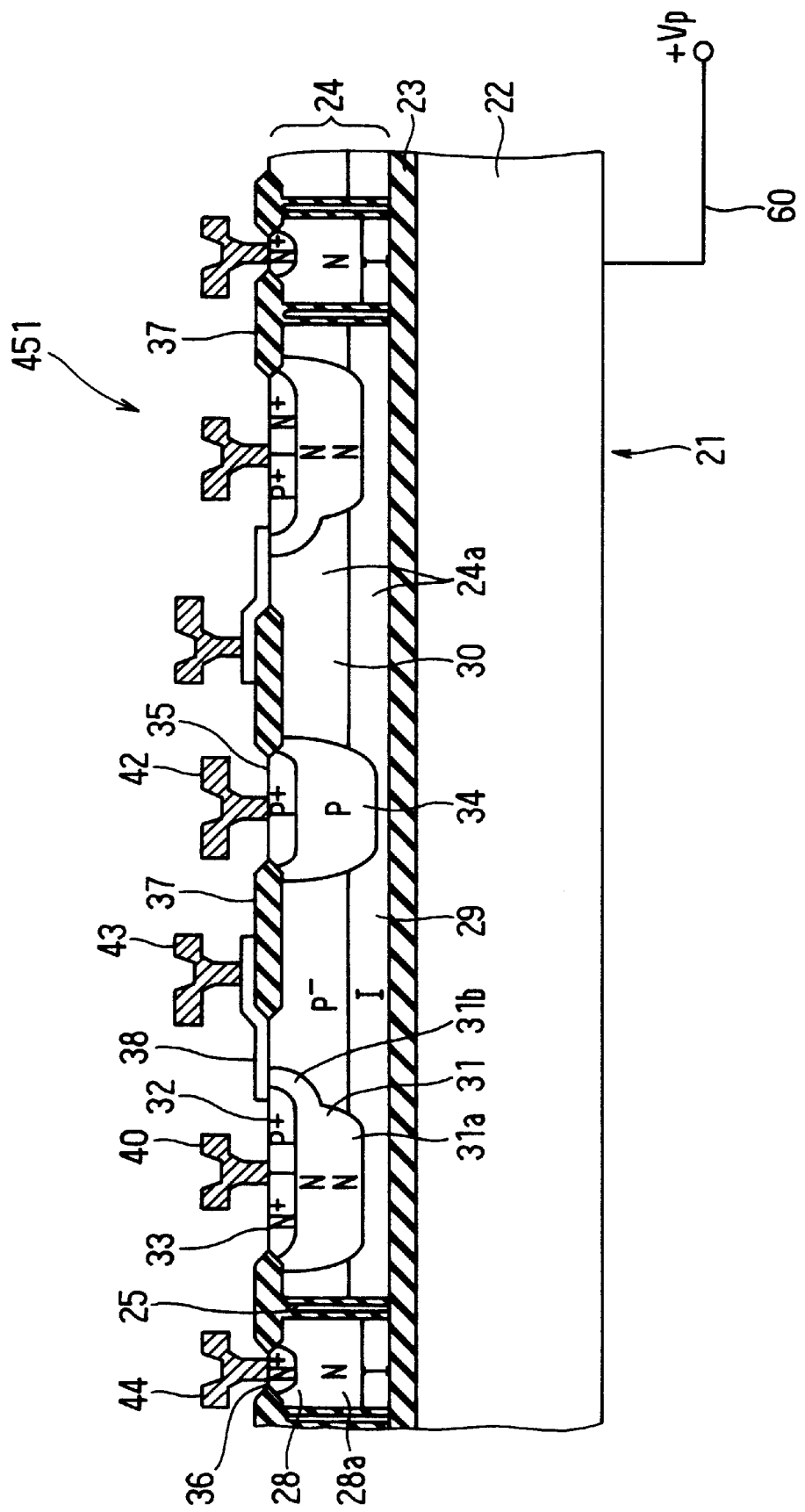

SEMICONDUCTOR APPARATUS HAVING HIGH WITHSTAND VOLTAGE

CROSS REFERENCE TO RELATED APPLICATIONS

This application is based upon and claims the benefit of Japanese Patent Application No. 10-120867, filed on Apr. 30, 1998, and No. 10-138322 filed on May 20, 1998, the contents of which are incorporated herein by reference.

BACKGROUND OF THE INVENTION

1. Field of the Invention

This invention relates to a semiconductor apparatus including a semiconductor substrate, an island region surrounded by a trench for isolation on the semiconductor substrate, a lateral type MOSFET formed in the island region, and a buffer region disposed around the island region for preventing electrical interference between the MOSFET and other elements.

2. Description of the Related Art

An LDMOS (Lateral Double-diffused MOSFET) is known as a MOSFET having a high withstand voltage. When several high withstand voltage LDMOSes are provided on an identical semiconductor substrate, or when an LDMOS and a logical circuit element are formed on an identical semiconductor substrate as a monolithic IC, a buffer region is conventionally formed at a periphery of the LDMOS to prevent electrical interference from other elements. For instance, FIGS. 1 and 2 show a semiconductor apparatus including such a buffer region.

The semiconductor apparatus shown in FIGS. 1 and 2 is a P channel type LDMOS, and has an SOI structure that is composed of a silicon layer 1 formed on a silicon support substrate 2 through a silicon oxide film 3 as an isolation film. The silicon layer 1 includes a silicon island layer 1a that is isolated from other element formation regions by a trench 4. The trench 4 is filled with a silicon oxide film and polysilicon for isolation. A low impurity concentration electric field relaxation layer 5 is formed in a lower part of the silicon island layer 1a contacting the silicon oxide film 3. The impurity concentration of the electric field relaxation layer 5 is controlled to be extremely small so that the relaxation layer 5 substantially functions as an intrinsic semiconductor.

A drift layer 6 composed of a P⁻ layer is formed in an upper part of the silicon island layer 1a with a low impurity concentration, which is higher than that of the electric field relaxation layer 5. A drain contact layer 7 composed of a P⁺ layer is formed in a surface portion of the drift layer 6, and a drain electrode 7a is formed on the drain contact layer 7.

An annular N-well 8a extending into the electric field relaxation layer 5 and an annular channel N-well 8b are concentrically formed around the drain contact layer 7 in the silicon island layer 1a. The N-well 8b is self-aligned relative to a gate polysilicon 9. An annular source diffusion layer 10 (P⁺ layer) as a source region and an annular source diffusion layer 11 (N⁺ layer) for fixing an electrical potential are formed in the N-well 8b. Further, a gate electrode 9a is disposed on the gate polysilicon 9, and a source electrode 10a is disposed on the source diffusion layers 10, 11. The drain electrode 7a, the gate electrode 9a, and the source electrode 10a are made of a first aluminum. As shown in FIG. 2, a part of the source electrode 10a is notched and the gate electrode 9a is electrically taken out through the notched portion.

Further, a LOCOS oxide film 12 is formed on specific portions of the single crystal silicon layer 1 to mitigate an electric field, and a buffer region 13 is formed to surround the silicon island layer 1a via the trench 4 for preventing electrical interference with another lateral MOSFET or a logical circuit element provided on the identical silicon layer 1. The buffer region 13 is formed by introducing N-type impurities into the silicon layer 1 at a specific depth. An N⁺ diffusion layer 14 is formed in the buffer region 13 for fixing an electrical potential, and a buffer region electrode 13a is formed on the N⁺ diffusion layer 14.

In an ordinal operational state, for instance, the support substrate 2 and the drain electrode 7a are grounded to have an identical electric potential, and a high positive voltage is applied to the source electrode 10a. The buffer region electrode 13a is brought to be a ground potential state.

In the constitution described above, since the electric field relaxation layer 5 is composed of a semiconductor layer with an extremely low impurity concentration, the drift layer 6 and the drain contact layer 7 (P type layer), the electric field relaxation layer 5 (substantially, I type layer: intrinsic semiconductor layer), and N-wells 8a, 8b (N type layer) substantially constitute a PIN structure. According to the element structure, when a high voltage is applied across the source electrode 10a and the drain electrode 7a of the P-channel MOSFET, the applied voltage is effectively divided by a depletion layer formed in the electric field relaxation layer 5 and the silicon oxide film 3, thereby achieving a high withstand voltage.

As a result of studies to the P type LDMOS, however, the inventors of the present invention found the following problem. That is, electric field is liable to concentrate in a surface portion of the silicon island layer 1a between the source diffusion layers 10, 11 and the trench 4, due to a potential difference between the source diffusion layers 10, 11 and the buffer region 13. This can cause avalanche breakdown, and result in deterioration of the withstand voltage. To solve this problem, it is conceivable to increase an interval between the trench 4 and the source diffusion layers 10, 11; however, this constitution decreases an element density.

SUMMARY OF THE INVENTION

The present invention has been made in view of the above problems. An object of the present invention is to proved a semiconductor apparatus with a simple structure capable of improving a withstand voltage without decreasing an element density.

According to a semiconductor apparatus of the present invention, a first element formation region and a second element formation region as an island region are provided in a semiconductor layer. The island region is surrounded by a trench region, and is further surrounded by a buffer region for preventing an electrical interference between the island region and the first element formation region. In the island region, source and drain regions are provided so that a first one of the source and drain regions is looped to be provided around a second one of the source and drain regions. Source and drain electrodes are respectively provided on the source and drain regions, and a gate electrode is provided over a portion of the island region between the source and drain regions.

In the semiconductor apparatus, when a first voltage having a specific polarity is applied to the first one of the source and drain regions through a corresponding one of the source and drain electrodes, a second voltage having the same polarity as that of the first voltage is applied to one of a specific portion of the island region, the trench region, and the support substrate. The specific portion of the island region is a portion between the trench region and the corresponding one of the source and drain electrodes.

For instance, when the first voltage is positive, the second voltage is positive as well. When the first voltage is a ground level, the second voltage is the ground level as well. Accordingly, an electric field is suppressed from concentrating on a portion between the trench region and the first one of the source and drain regions, resulting in improvement of a withstand voltage. It is not necessary to increase an interval between the trench region and the first one of the source and drain regions. That is, it is not necessary to decrease an element density to improve the withstand voltage.

Preferably, an auxiliary electrode is provided on the specific portion for receiving the second voltage. More preferably, the auxiliary electrode is electrically connected to the corresponding one of the source and drain electrodes. When the trench region is filled with a trench region semiconductor layer at least at a surface portion thereof, the auxiliary electrode can be electrically connected to the trench region semiconductor layer. The semiconductor apparatus can have support substrate connection means electrically connected to the support substrate for applying the second voltage to the support substrate.

BRIEF DESCRIPTION OF THE DRAWINGS

Other objects and features of the present invention will become more readily apparent from a better understanding of the preferred embodiments described below with reference to the following drawings.

FIG. 14 is a cross-sectional view showing an LDMOS in a fourth preferred embodiment;

DETAILED DESCRIPTION OF THE PREFERRED EMBODIMENTS (First Embodiment)

Figure 3:
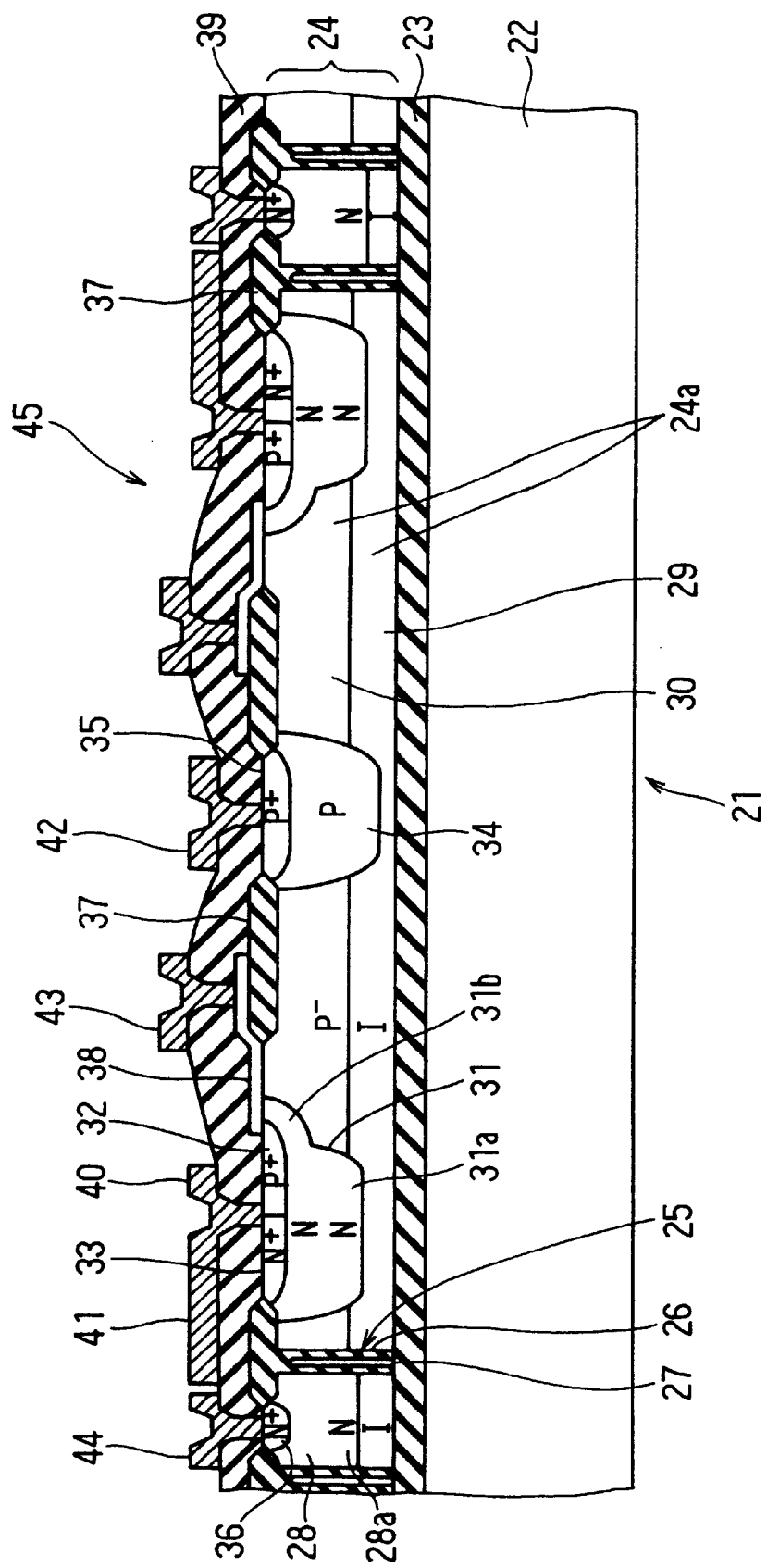
FIG. 3 is a cross-sectional view showing an LDMOS in a first preferred embodiment.

A first preferred embodiment will be explained referring to FIGS. 3 to 10. Referring to FIG. 3, a high withstand voltage LDMOS 45 in the first embodiment includes an SOI substrate 21, which is composed of a support substrate 22 made of a single crystal silicon substrate, and a single crystal silicon layer 24 provided on the support substrate 22 through a silicon oxide film 23. A silicon island layer 24a is formed in the single crystal silicon layer 24 to be isolated from other element formation regions by an annular trench 25 for isolation. The thickness of the single crystal silicon layer 24 is approximately 10 μm. The trench 25 is filled with a silicon oxide film 26 and polysilicon 27 for isolation.

A buffer region 28 is formed at an outer peripheral portion of the silicon island layer 24a in the single crystal silicon layer 24, i.e., at an outside of the trench 25. An electric field relaxation layer 29 is formed in a part of the silicon island layer 24a to contact the silicon oxide film 23. The electric field relaxation layer 29 is a single crystal silicon layer, into which impurities such as boron, phosphorus, arsenic, or antimony are doped with an extremely low impurity concentration (less than approximately $1 \times 10^{14}/cm^3$), and therefore serves substantially as an intrinsic semiconductor layer. The thickness of the electric field relaxation layer 29 is controlled to be equal to or more than 1 μm.

A drift layer 30 composed of a P⁻ layer is formed in the upper portion of the silicon island layer 24a. The drift layer 30 is formed as a low impurity concentration layer to have relatively high resistance; however, the impurity concentration (for instance, approximately $2.5 \times 10^{15}/cm^3$) is higher than that of the electric field relaxation layer 29.

A double-well 31 is formed in the silicon island layer 24a by diffusing N type impurities from the surface of the drift layer 30 so as to have an annular (for instance, elliptic) planar shape. The double-well 31 is composed of an N well 31a extending into the electric field relaxation layer 29 and an N well 31b continuously formed with the N well 31a to be positioned in a surface portion of the N well 31a. In this case, the impurity concentration (surface concentration) of the N well 31a is set at, for instance, around $4.0 \times 10^{16}/cm^3$, and the impurity concentration (surface concentration) of the N well 31b is set at, for instance, around $4.5 \times 10^{16}/cm^3$. The N well 31b is formed together with a source diffusion layer 32 made of a P⁺ diffusion layer by a well-known double-diffusion technique. Accordingly, a P channel region can be formed in the surface portion of the N well 31b.

A source diffusion layer 33 made of an N⁺ diffusion layer is further formed in a surface portion of the N well 31 for fixing an electrical potential. In this case, since the N wells 31a, 31b, and the source diffusion layers 32, 33 have annular planar shapes, respectively, the p channel region is inevitably formed to have an annular planar shape. The annularly shaped P channel region relaxes concentration of electric field, thereby making it possible to flow a large amount of current in the FET structure.

A P well 34 is formed in the silicon island layer 24a as a deep drain region to be positioned at the central portion of the annular source diffusion layers 32, 33. The P well 34 extends to the depth that is approximately the same as or slightly deeper than the junction depth of the N well 31a. A drain contact layer 35 made of a P$^+$ diffusion layer is disposed in a surface portion of the P well 34. The impurity concentration of the P well 34 is set at an intermediate value between the impurity concentration of the drift layer 30 and the impurity concentration of the drain contact layer 35. For instance, the impurity concentration (surface concentration) of the drift layer 30 is around $2.5 \times 10^{16}/cm^3$, the impurity concentration (surface concentration) of the drain contact layer 35 is more than approximately $1.0 \times 10^{19}/cm^3$, and the impurity concentration (surface concentration) of the P well 34 is around $1.1 \times 10^{17}/cm^3$.

In the buffer region 28, an impurity diffusion layer 28a is formed to have a junction depth that is approximately the same as that of the N well 31a, and a buffer region contact layer 36 made of an N$^+$ diffusion layer is provided in a surface portion of the impurity diffusion layer 28a.

A LOCOS oxide film 37 is disposed on the single crystal silicon layer 24 at portions between the N well 31b and the drain contact layer 35, between the N well 31b and the buffer region 28, and the like so as to relax an electric field. A gate polysilicon film 38 is formed on the P channel region described above through a gate oxide film (silicon oxide film) that is not shown. The gate polysilicon film 38 is also annularly shaped to correspond to the P channel region. An insulation film 39 is further formed on the single crystal silicon layer 24 to cover the source diffusion layers 32, 33, the drain contact layer 35, the buffer region contact layer 36, the LOCOS oxide film 37, the gate polysilicon film 38, and the like.

Electrode films are formed from a first aluminum on the insulation film 39. Specifically, referring to FIGS. 4 and 5, a source electrode film 40 is annularly formed at a position corresponding to the source diffusion layers 32, 33 to be electrically connected to the source diffusion layers 32, 33 through contact holes. An auxiliary electrode film 41 is annularly formed to integrally extend from the source electrode film 40 and to extend over the trench 25. A pole-like drain electrode film 42 is formed at a position corresponding to the drain contact layer 35 to be electrically connected to the drain contact layer 35 through a contact hole. Further, a gate electrode film 43 is annularly formed at a position corresponding to the gate polysilicon film 38 to be electrically connected to the gate polysilicon film 38 through a contact hole. As shown in FIG. 6, a buffer region electrode film 44 is formed with a rectangular frame pattern corresponding to the buffer region contact layer 36 to be electrically connected to the contact layer 36 through a contact hole.

Figure 5:
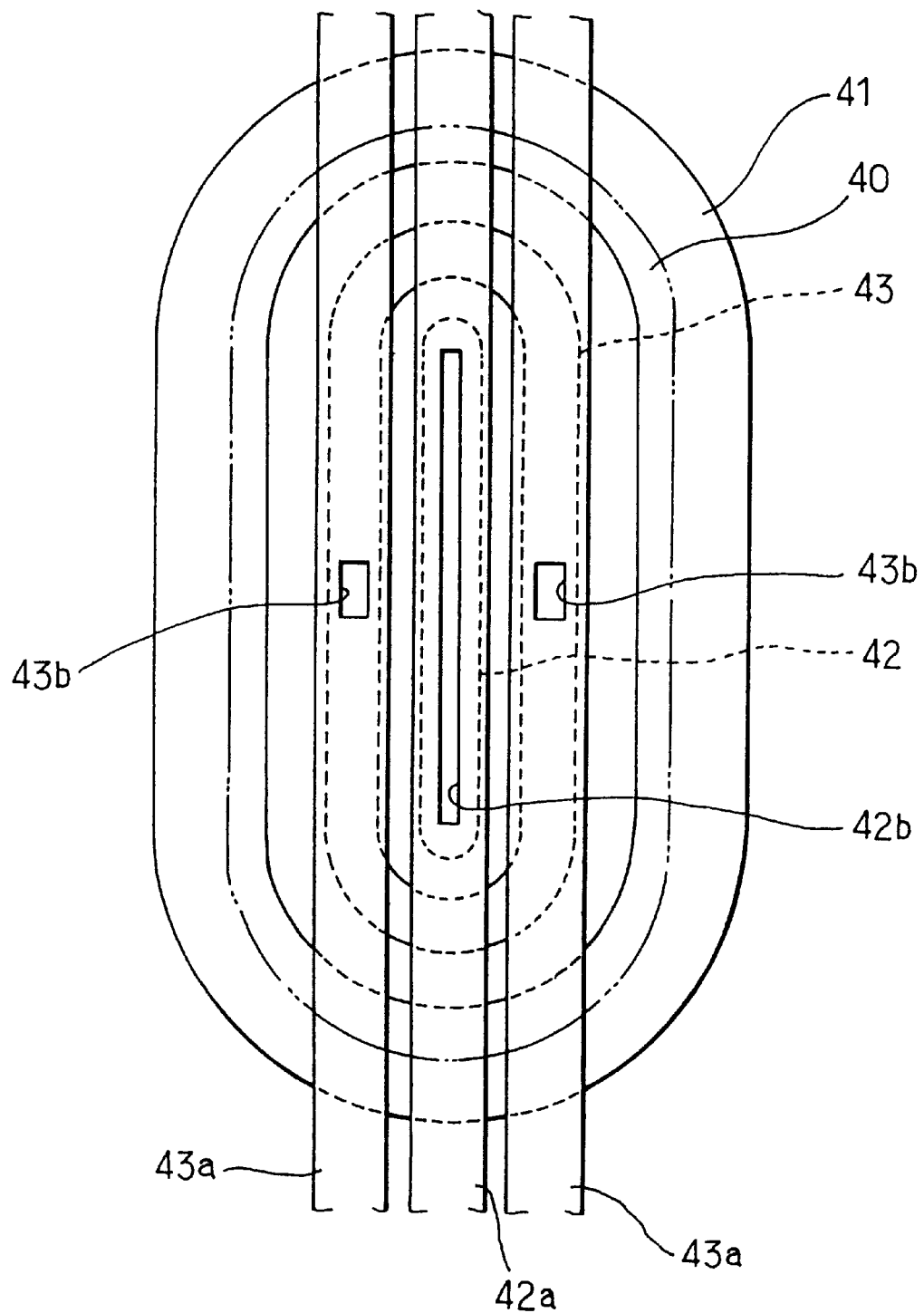
FIG. 5 is a plan view showing the wiring pattern made of the first aluminum and a wiring pattern made of a second aluminum in the LDMOS shown in FIG. 3.
Figure 6:
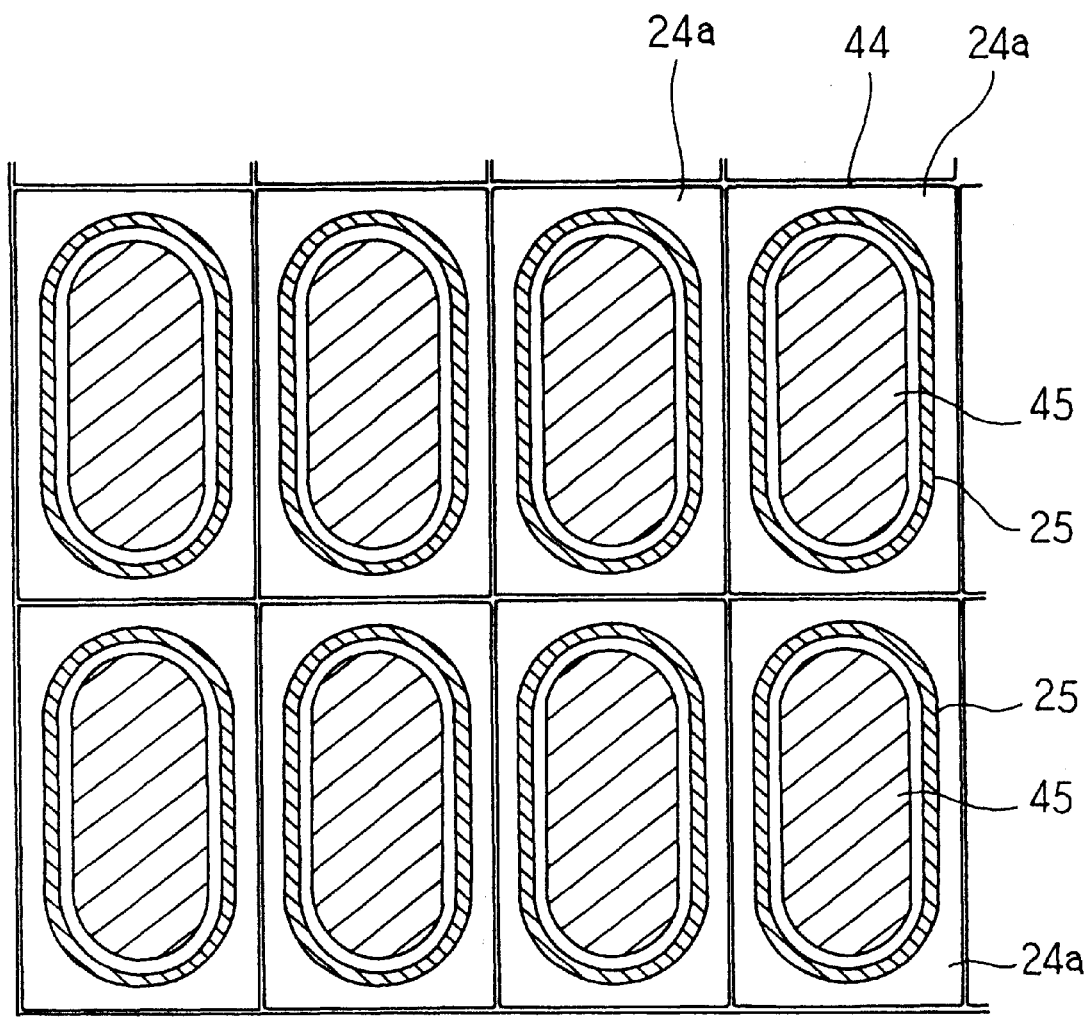
FIG. 6 is a plan view showing an arrangement of LDMOSes on an SOI substrate in the first embodiment.

Since the source electrode film 40, the auxiliary electrode film 41, and the gate electrode film 43 are annularly formed from the first aluminum, as shown in FIG. 5, the gate electrode film 43 and the drain electrode film 42 are taken out utilizing a second aluminum. Specifically, gate wiring segments 43a made of the second aluminum are connected to the gate electrode film 43 through via-holes 43b, and drain wiring segments 42a are connected to the drain electrode film 42 through a via-hole 42b.

According to the constitution described above, the drain center type P channel LDMOS 45 is provided with the drain contact layer 35 and the source diffusion layers 32, 33, which are concentrically and annularly arranged around the drain contact layer 35. In the LDMOS 45, a PIN structure is substantially composed of the drift layer 30, the P well 34, the drain contact layer (P type layer) 35, the double-well (N type layer) 31, and the electric field relaxation layer (substantially, I type layer) 29.

Further, as shown in FIG. 6, plural silicon island layers 24a and a logical element formation region (not shown) are provided on the SOI substrate 21. The LDMOS 45 is formed in each of the silicon island layers 24a, and the logical circuit elements (not shown) constituting an operation control IC for the LDMOS 45 are formed in the logical element formation region. In FIG. 6, the regions where LDMOSes 45 and the isolation trenches 25 are formed are hatched with slant lines.

Figure 7A:
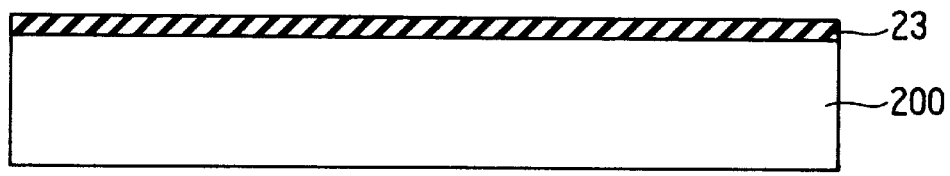
FIGS. 7A to 7G are cross-sectional views showing a manufacturing process of the LDMOS in a stepwise manner in the first embodiment.

Next, a method of manufacturing the LDMOS 45 described above will be explained referring to FIGS. 7A to 7G. First, as shown in FIG. 7A, a single crystal silicon substrate 200 having a (100) plane orientation is prepared. The single crystal silicon substrate 200 is composed of either one of a high resistant FZ substrate and a CZ substrate into which impurities such as boron, phosphorus, arsenic, antimony, or the like are doped with an extremely low concentration (lower than approximately $1 \times 10^{14}/cm^3$). The silicon oxide film 23 is formed on the substrate 200 by thermal oxidation to have a thickness of approximately 0.5 µm or more.

Figure 7B:
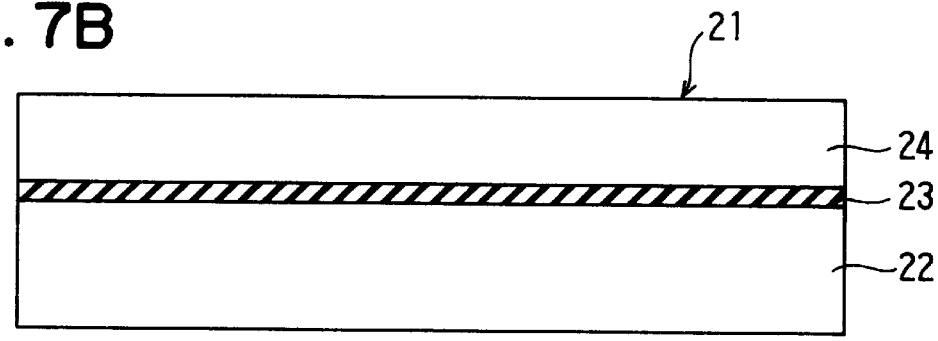

Next, as shown in FIG. 7B, the SOI substrate 21 is formed by performing a bonding step and a polishing step. Specifically, at the bonding step, first, the P type or N type mirror-finished support substrate 22 is prepared. Then, a hydrophilicizing treatment is performed to the surface of the support substrate 22 and to the surface of the silicon oxide film 23 on the single crystal silicon substrate 200. The hydrophilicizing treatment includes cleaning using a mixture of sulfuric acid and hydrogen peroxide ($H_2SO_4:H_2O_2=$ 4:1) kept at in a range of approximately 90° C. to 120° C., pure water cleaning, and spin drying, which are successively performed in this order. Amounts of water adsorbed on the surfaces of the substrates 22, 200 are controlled by spin drying. After that, the hydrophilicized surfaces of the support substrate 22 and the single crystal silicon substrate 200 are brought to be closely contact one another, and undergo a heat treatment to be integrated (bonded) with one another.

At the polishing step described above, the single crystal silicon substrate 200 is ground and polished from the surface opposite the bonding interface so that the thickness thereof becomes approximately 10 µm, thereby providing the single crystal silicon layer 24. As a result, the SOI substrate 21 is provided. In the present embodiment, the silicon oxide film 23 is formed on the single crystal silicon substrate 200; however, it may be formed on the support substrate 22 or on both substrates 22, 200.

Figure 7C:
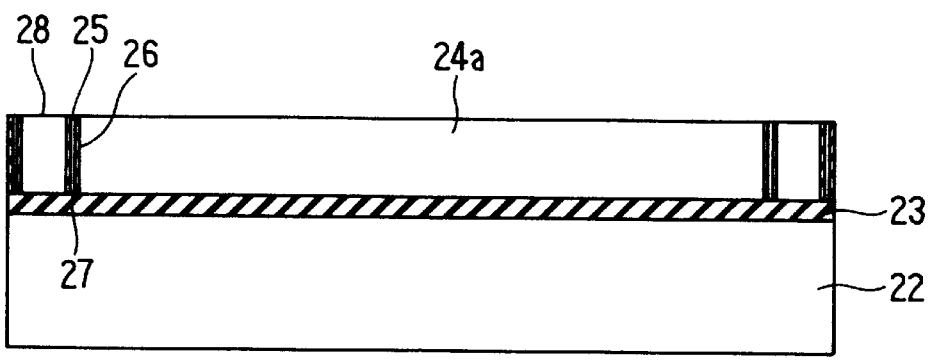

Successively, referring to FIG. 7C, after a silicon oxide film (not shown) is formed on the single crystal silicon layer 24 by, for instance, a CVD method, the trench 25 for isolation is formed using a photo-lithography technique and a dry etching technique. Next, after the silicon oxide film 26 is formed on the inside wall of the trench by thermal oxidation or the like to have a thickness more than approximately 0.5 µm, the trench is filled with the polysilicon 27. Then, the silicon oxide film (not shown) described above is removed and the surface is flattened by a grinding and polishing processing or an etch back method. Consequently, the silicon island layer 24a isolated by the trench 25 is provided, and the buffer region 28 is provided around the silicon island layer 24a via the trench 25.

Figure 7D:
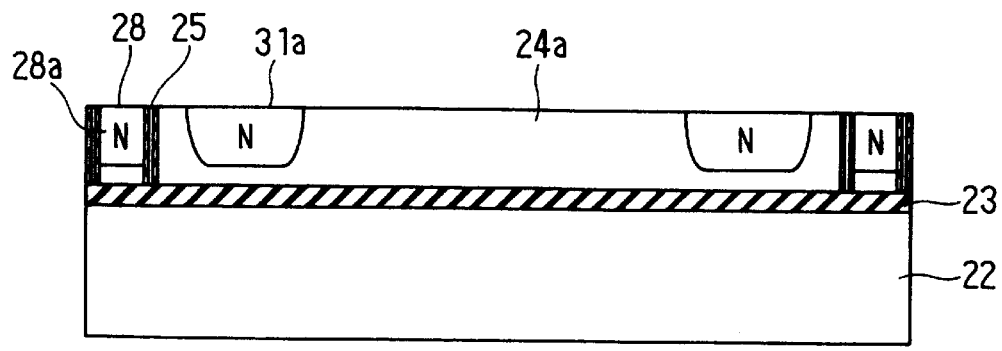

After that, referring to FIG. 7D, in a state where a mask opening at positions corresponding to the N well 31a and the buffer region 28 is disposed, ion implantation of N type impurities is performed. Then, the mask described above is removed. Accordingly, the N well 31a and the impurity diffusion layer 28a are formed with an equal junction depth. Then, thermal diffusion is performed.

Figure 7E:
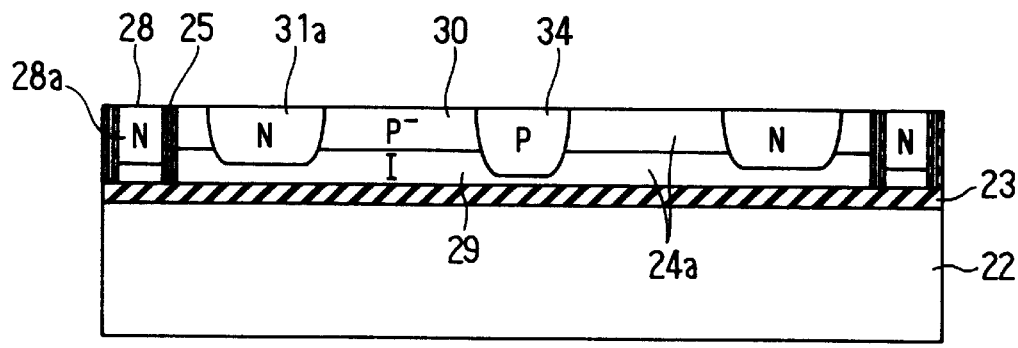

Subsequently, referring to FIG. 7E, in a state where a mask opening at a position corresponding to the P well 34, ion implantation of P type impurities is performed, and then the mask is removed. After that, thermal diffusion is performed, thereby forming the P well 34. Ion implantation of the P type impurities and the thermal diffusion are further performed, thereby forming the drift layer 30. Part of the silicon island layer 24a other than the drift layer 30 remains as the electric field relaxation layer 29.

Figure 7F:
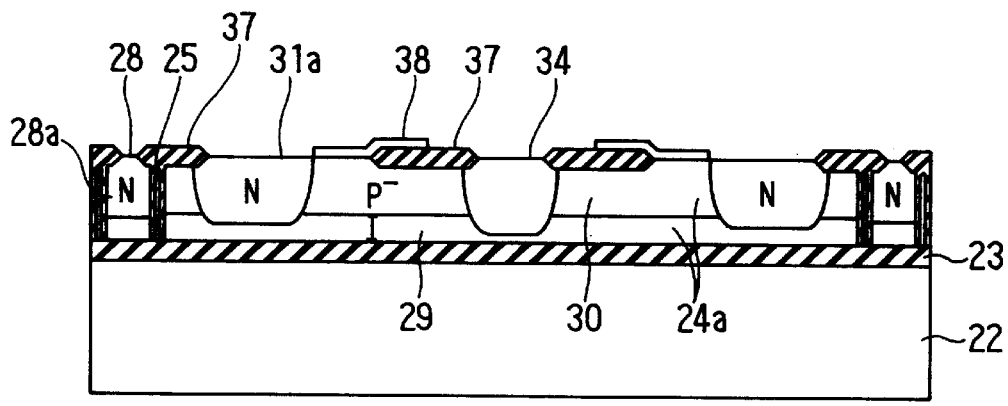
Figure 7G:
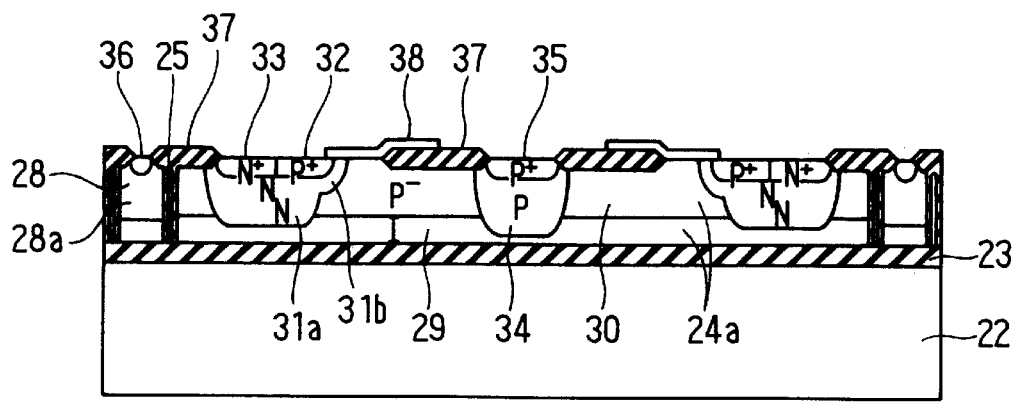

Then, as shown in FIG. 7F, the LOCOS oxide film 37, the silicon oxide film as the gate oxide film that is not shown, and the gate polysilicon film 38 are formed by well-known methods. Further, as shown in FIG. 7G, the N well 31b, the source diffusion layers 32, 33, the drain contact layer 35, and the buffer region contact layer 36 are formed by well-known techniques including a double-diffusion technique. After forming the insulation film 39, the source electrode film 40, the drain electrode film 42, the gate electrode film 43, the buffer region electrode film 44, and the wiring segments 42a, 43a are formed. Consequently, the LDMOS 45 shown in FIG. 3 is provided.

Next, an operation of the LDMOS 45 in the present embodiment will be explained. In a practical operational state, a positive voltage is applied to the source electrode film 40 and the auxiliary electrode film 41, and a ground potential level voltage is applied to the drain electrode film 42 and the buffer region electrode film 44. Further, a specific gate bias voltage is applied to the gate electrode film 43. The support substrate 22 is connected to be the ground potential level. Accordingly, a current having a magnitude corresponding to the gate bias voltage flows between the source diffusion layers 32, 33 and the drain contact layer 35.

In the high voltage applying state described above, an electric field concentration phenomenon is liable to occur between the source diffusion layers 32, 33 and the isolation trench 25 due to a potential difference between the source diffusion layers 32, 33 and the buffer region 28. However, according to the constitution in the present embodiment, since the high voltage is applied not only to the source electrode film 40 but also to the auxiliary electrode film 41 that is disposed over the isolation trench 25, an electric field concentration part moves to the isolation trench side by a field plate effect of the auxiliary electrode film 41.

Figure 1:
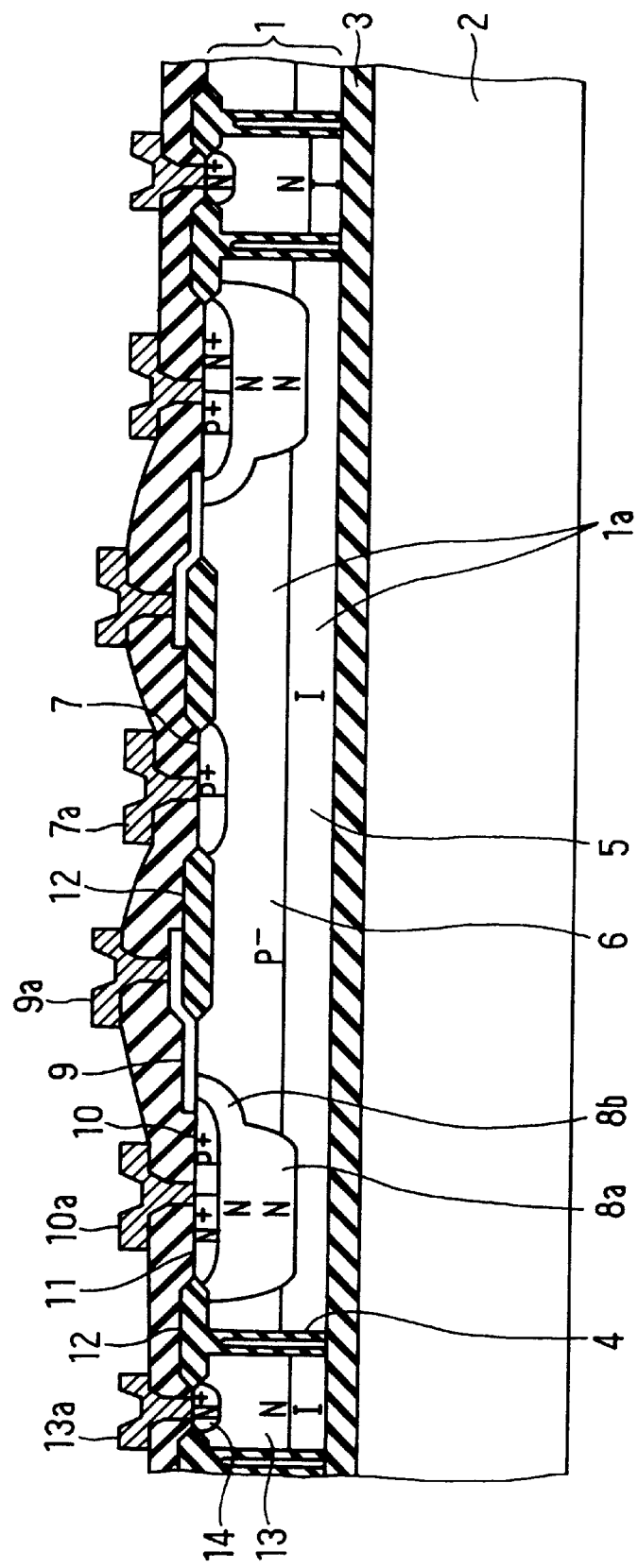
FIG. 1 is a cross-sectional view showing an LDMOS according to a prior art.
Figure 2:
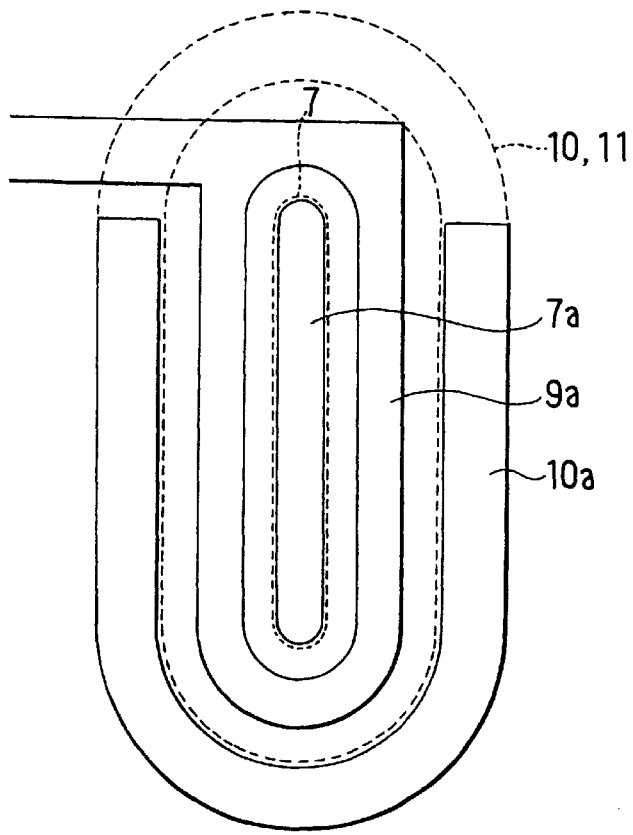
FIG. 2 is a plan view showing a wiring pattern in the LDMOS shown in FIG. 1.
Figure 4:
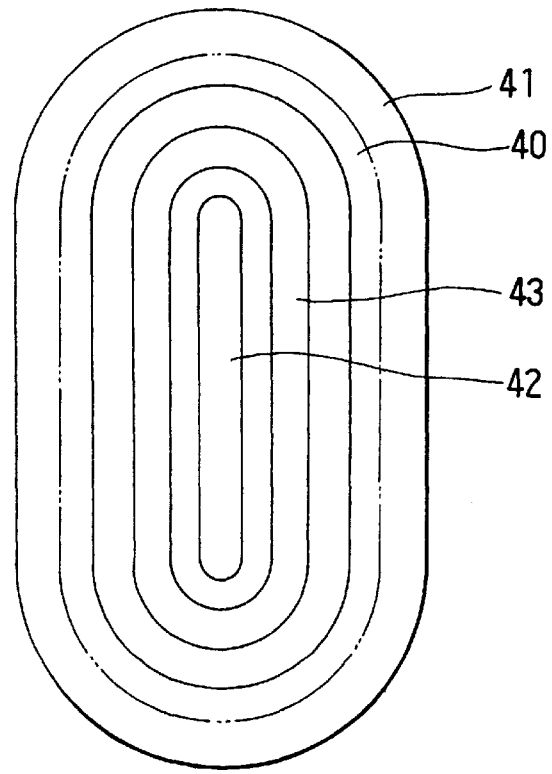
FIG. 4 is a plan view showing a wiring pattern made of a first aluminum in the LDMOS shown in FIG. 3.

This phenomenon will be explained in more detail referring to FIGS. 8 and 9 indicating equipotential distribution curves, which were obtained by a simulation using models of the P channel LDMOS 45 shown in FIG. 3 in the present embodiment and the conventional P channel LDMOS shown in FIG. 1, respectively. More specifically, FIGS. 8 and 9 shows the states of the LDMOSes when a positive high voltage (210 V) was applied to the source electrode film 40 (10a) while setting the support substrate 22 (2), the buffer region 28 (13), and the drain electrode film 42 (7a) to the ground potential.

Figure 8:
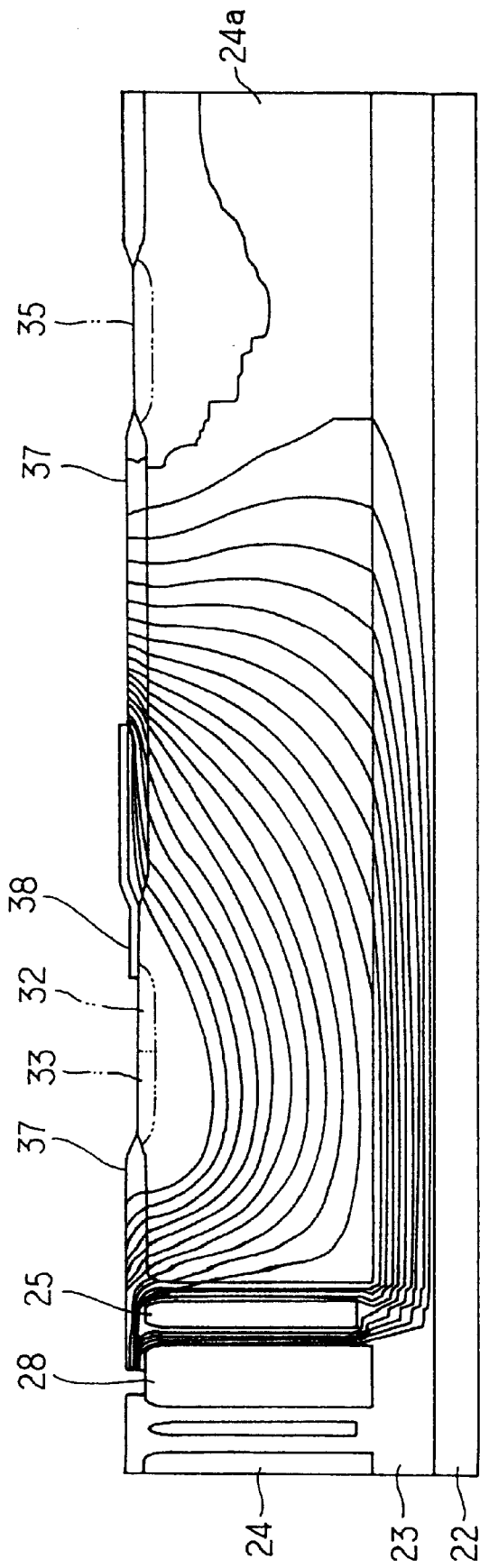
FIG. 8 is a characteristic view showing equipotential distribution of the LDMOS in the first embodiment.
Figure 9:
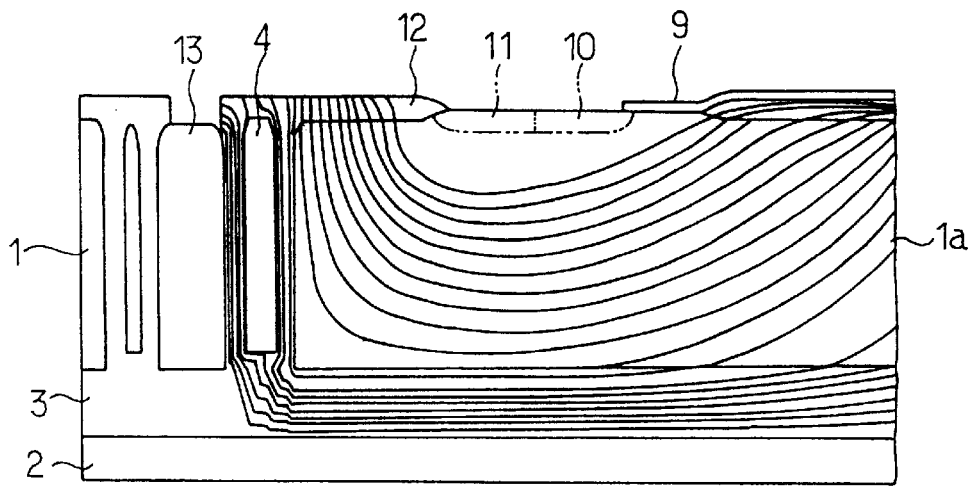
FIG. 9 is a characteristic view showing equipotential distribution of the LDMOS shown in FIG. 1.

Comparing FIG. 8 in the present embodiment with FIG. 9, it is confirmed that the electric field concentration part produced in the surface portion of the single crystal silicon substrate layer 24 moves to the isolation trench side. Specifically, in FIG. 8, seven equipotential curves pass through the substrate surface, and to the contrary, in FIG. 9, ten equipotential curves remain.

Thus, according to the constitution in the present embodiment, the phenomenon such that the electric field concentrates in the surface portion between the source diffusion layers 32, 33 and the isolation trench 25 in the single crystal silicon layer 24 is relaxed. As a result, even when a high voltage is applied across the source diffusion layers 32, 33 and the drain contact layer 35, it becomes difficult to cause an avalanche breakdown in the surface portion, resulting in improvement of a withstand voltage. That is, the improvement of the withstand voltage is easily realized only by forming the auxiliary electrode film 41.

In addition, since the auxiliary electrode film 41 is annularly formed over the isolation trench 25, the auxiliary electrode film 41 can exhibit the field-plate effect as a whole. This also contributes the improvement of the withstand voltage. Since a space, in which a depletion layer extends, needs not be increased between the isolation trench 25 and the source diffusion layers 32, 33, an element density is not decreased. Further, the auxiliary electrode film 41 is integrally formed with the source electrode film 40, the auxiliary electrode film 41 does not require an exclusive member for applying a voltage thereto, resulting in simplification of the constitution.

Figure 10:
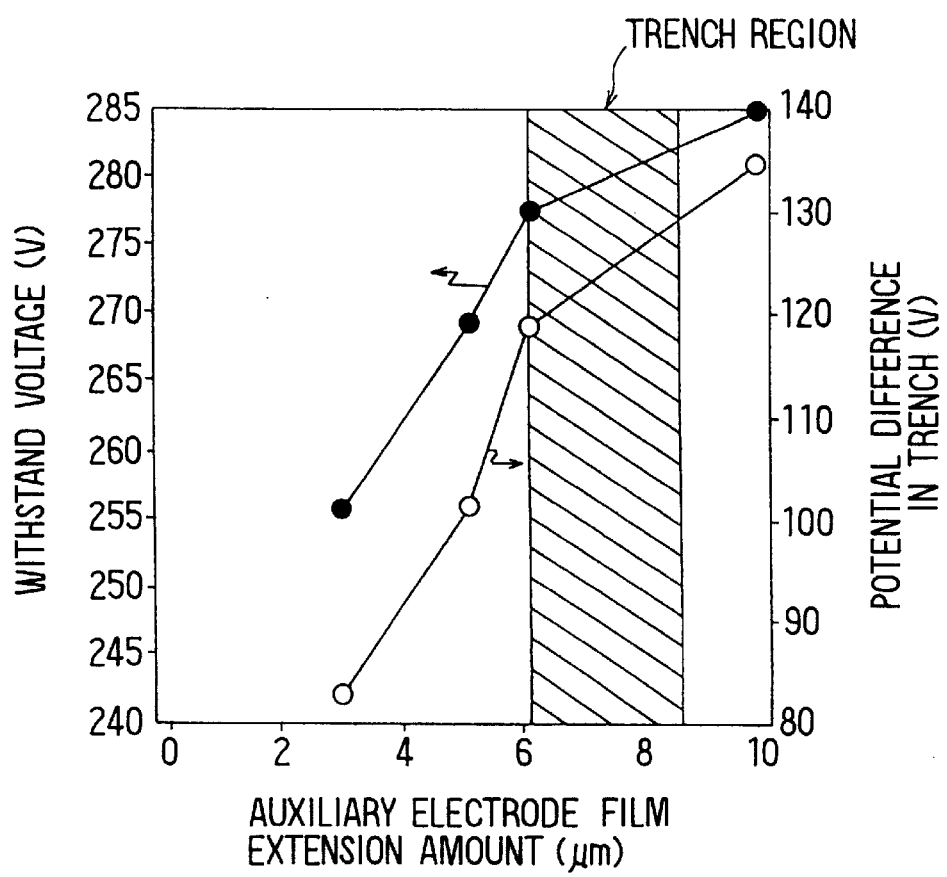
FIG. 10 is a graph showing withstand voltage characteristics of the LDMOS in the first embodiment.

Next, the effect obtained by forming the auxiliary electrode film 41 will be more specifically explained referring to FIG. 10, which shows results of measurement practically performed to the LDMOS 45 having a specific size. A horizontal axis of FIG. 10 indicates extension amounts of the auxiliary electrode film 41 from the source electrode film 40, and vertical axes of FIG. 10 indicate withstand voltages of the LDMOS 45 and potential differences within the trench 25 for isolation. A hatched region corresponds to a region where the trench 25 is formed. According to FIG. 10, it is confirmed that the larger the extension amount of the auxiliary electrode film 41 becomes, the larger the withstand voltage becomes. When the auxiliary electrode film 41 is disposed over the isolation trench 25 as in the present embodiment, the withstand voltage is expected to be sufficiently improved.

In the embodiment described above, the auxiliary electrode film 41 is disposed over the trench 25 for isolation; however, it is sufficient for improving the withstand voltage that the auxiliary electrode film 41 is disposed in close proximity to the trench 25. It is not always necessary to disposed the auxiliary electrode film 41 directly over the trench 25.

Also, the embodiment described above is applied to the drain center type P channel LDMOS 45, which can have a state where a potential difference is produced between the source diffusion layers 32, 33 and the buffer region 28. However, the constitution of the present embodiment can be applied to a drain center type N channel LDMOS with an auxiliary electrode film 41 similar to that in the present embodiment. In the N channel LDMOS, since a large potential difference can be produced between source diffusion layers and a buffer region when a ground potential level voltage is applied across a drain contact layer and a buffer region and a negative high voltage is applied to a source diffusion layer, the auxiliary electrode film 41 is effective to relax electric field concentration.

(Second Embodiment)

Figure 11:
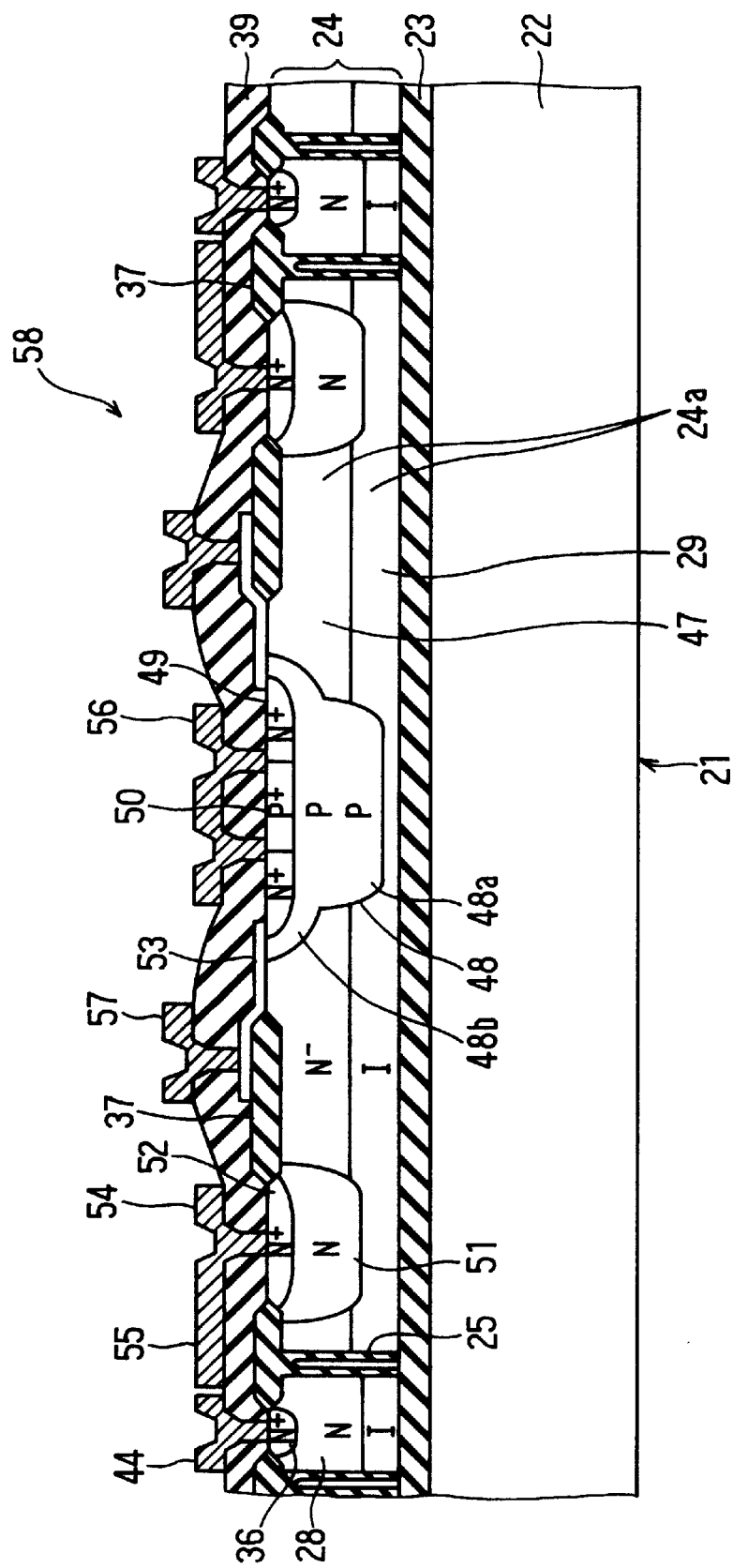
FIG. 11 is a cross-sectional view showing an LDMOS in a second preferred embodiment.

In a second preferred embodiment, the present invention is applied to a source center type N channel LDMOS 58 shown in FIG. 11. Herebelow, only points different from those in the first embodiment will be explained. The same parts as in FIG. 3 are indicated by the same reference numerals.

In FIG. 11, a P well 48a is formed at the central portion of a silicon island layer 24a including an electric field relaxation layer 29 and a drift layer 47 that is made up of an N⁻ diffusion layer. A P well 48b for forming a channel is continuously formed with the P well 48a, thereby providing a double-well 48. The P well 48b described above is formed by a well-known double diffusion technique together with an annular source diffusion layer 49 made of an N⁺ diffusion layer. Accordingly, the LDMOS 58 has a constitution capable of forming an annular N channel region in a surface portion of the P well 48b. A source diffusion layer 50 that is made of a P⁺ diffusion layer for fixing an electrical potential of the P well 48b is formed in part of the surface portion of the P well 48b to be surrounded by the source diffusion layer 49.

An N well 51 is formed in the silicon island layer 24a as a deep drain region, in which N type impurities are diffused, to surround the source diffusion layers 49, 50. The position where the N well 51 is formed is adjacent to the trench 25 for isolation. Further, an annular drain contact layer 52 made of an N⁺ diffusion layer is formed in a surface portion of the N well 51. A gate polysilicon film 53 is formed at a position where the N channel region is to be formed in the P well 48b through a gate oxide film (silicon oxide film) that is not shown. The gate polysilicon film 53 is also formed into an annular shape to correspond to that of the N channel region.

Electrode films are formed from a first aluminum on an insulation film 39 as follows. That is, a drain electrode film 54 is annularly formed at a position corresponding to the drain contact layer 52 to be electrically connected to the drain contact layer 52 through a contact hole. An auxiliary electrode film 55 is annularly and integrally formed with the drain electrode film 54 to extend over the trench 25. A source electrode film 56 is formed with, for instance, a pole-like shape, at a position corresponding to the source diffusion layers 49, 50 to be electrically connected to the source diffusion layers 49, 50 through contact holes. A gate electrode film 57 is annularly formed at a position corresponding to the gate polysilicon film 53 to be electrically connected to the gate polysilicon film 53 through a contact hole. A buffer region electrode film 44 is further formed at a position corresponding to the buffer region contact layer 36.

Accordingly, the source center type N channel LDMOS 58 is provided with the source diffusion layers 49, 50, and the annular drain contact layer 52 that is concentrically arranged around the source diffusion layers 49, 50.

In the present embodiment, in a practical operational state, a positive voltage is applied to the drain electrode film 54 and the auxiliary electrode film 55, and a ground potential level voltage is applied to the source electrode film 56 and to the buffer region electrode film 44. Further, a specific gate bias voltage is applied to the gate electrode film 57. The support substrate 22 is connected to be the ground potential level. Accordingly, current corresponding to the gate bias voltage flows between the drain contact layer 52 and the source diffusion layers 49, 50.

In this case, since the same level voltage as that to the drain electrode film 54 is applied to the auxiliary electrode film 55 extending over the isolation trench 25, electric field concentration part in the surface portion of the single crystal silicon layer 24 is shifted toward the isolation trench side by a field plate effect of the auxiliary electrode film 55 similarly to the first embodiment. As a result, as in the first embodiment, the electric field concentration in the surface portion of the single crystal silicon layer 24 between the drain contact layer 52 and the isolation trench 25 is relaxed. Even when a high voltage is applied across the drain contact layer 52 and the source diffusion layers 49, 50, it becomes difficult to cause avalanche breakdown in the surface portion described above, resulting in improvement of the withstand voltage. That is, the withstand voltage is improved with a simple constitution only additionally providing the auxiliary electrode film 55.

Incidentally, in the second embodiment, the auxiliary electrode film 55 is disposed over the isolation trench 25; however, it is not always necessary to disposed the auxiliary electrode film 55 over the isolation trench 25 due to the same reasons as described in the first embodiment. The auxiliary electrode film 55 is sufficient to be disposed in close proximity to the isolation trench 25 to improved the withstand voltage.

Also, in the second embodiment, the present invention is applied to the source center type N channel LDMOS 58 capable of producing a state where a potential difference is produced between the drain contact layer 52 and the buffer region 28; however, it may be effectively applied to a source center type P channel LDMOS with the auxiliary electrode film 55. This is because, in the P channel LDMOS, a large potential difference can be produced between the drain contact layer and the buffer region in a state where a negative high voltage is applied to the drain contact layer and the ground level voltage is applied to the source diffusion layers and the buffer region.

(Third Embodiment)

Figure 12:
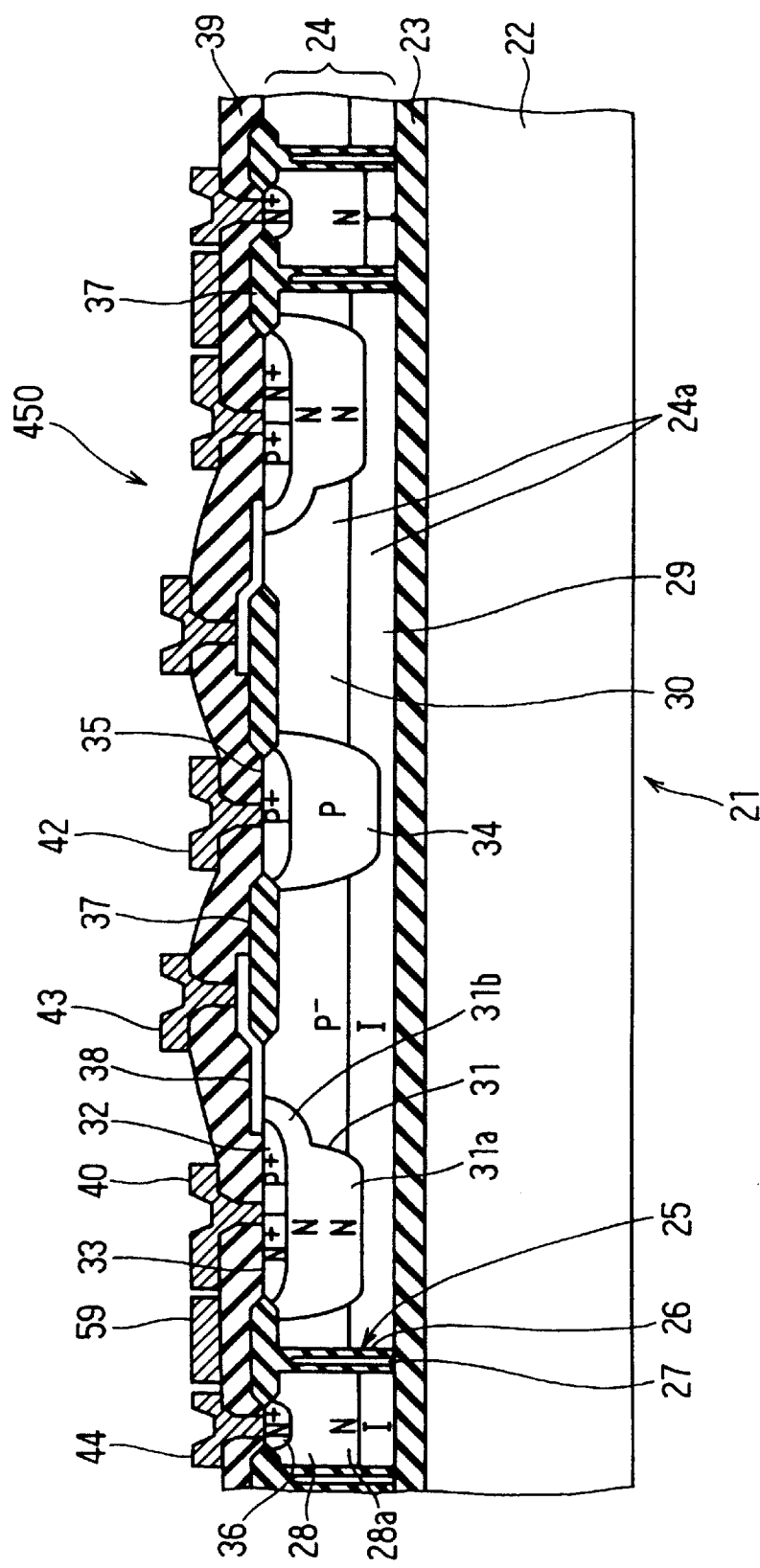
FIG. 12 is a cross-sectional view showing an LDMOS in a third preferred embodiment.
Figure 13:
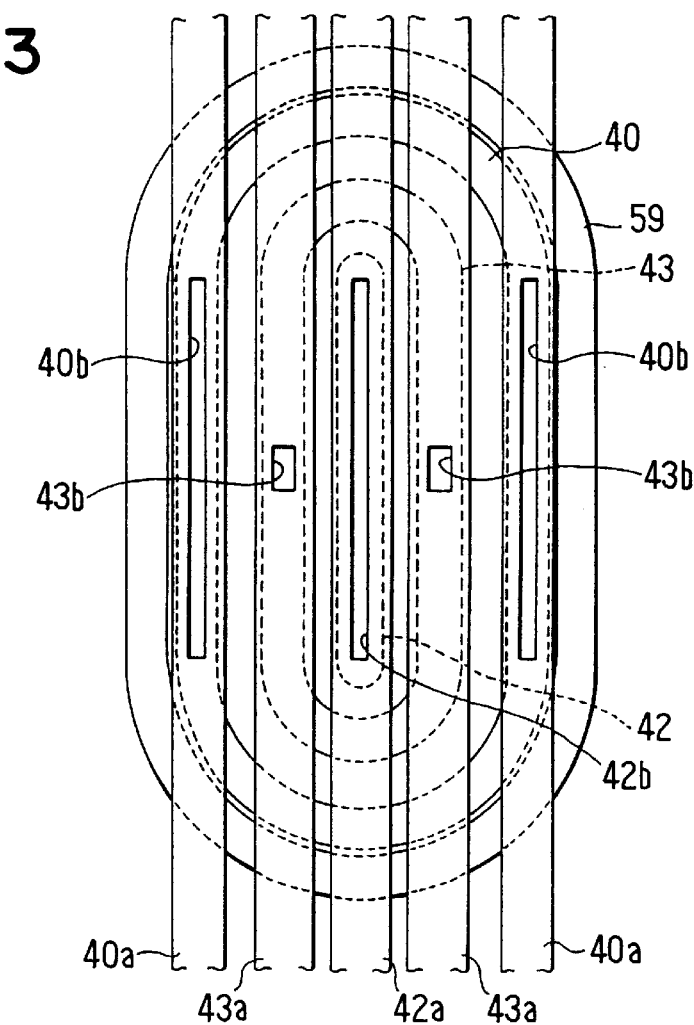
FIG. 13 is a plan view showing a wiring pattern made of a first aluminum in the LDMOS shown in FIG. 12.

FIGS. 12 and 13 shows a third preferred embodiment that exhibits the same effects as in the first embodiment. Herebelow, only points different from those of the first embodiment will be explained.

In the third embodiment, a drain center type P channel LDMOS 450 is adopted with a structure basically the same as that in the first embodiment. A differential point is that an auxiliary electrode film 59 made of the first aluminum is provided separately from the source electrode film 40. The auxiliary electrode film 59 is annularly disposed over the isolation trench 25. A voltage having a level substantially the same as that to the source electrode film 40 is applied to the auxiliary electrode film 59 through a wiring pattern that is not shown.

In the third embodiment, since the annular auxiliary electrode film 59 surrounds the source electrode film 40 and the like, the source electrode film 40, the drain electrode film 42, and the gate electrode film 43 are electrically and respectively taken out utilizing the second aluminum as shown in FIG. 13. Specifically, the source electrode film 40 is electrically connected to source wiring segments 40a made of the second aluminum through via holes 40b. As in the first embodiment, the drain electrode film 42 is connected to the drain wiring segment 42a made of the second aluminum through the via hole 42b, and the gate electrode film 43 is connected to the gate wiring segments 43a made of the second aluminum through the via holes 43b. The other features and effects are the same as those in the first embodiment.

In the third embodiment, the drain center type LDMOS 450 has the auxiliary electrode film 59 separately formed from the source electrode film 40; however, the source center type LDMOS 58 as in the second embodiment may have the auxiliary electrode film 56 separately formed from the drain electrode film 54. In this case, voltage having a level approximately equal to that applied to the drain electrode is independently applied to the auxiliary electrode film 56.

The first to third embodiments adopt deep drain structures (P well 34, N well 51), respectively. However, it is not always necessary to adopt these deep drain structures. In the first and third embodiments, the source electrode film 40 and the auxiliary electrode film 41 are annularly shaped, and in the second embodiment, the drain electrode film 54 and the auxiliary electrode film 56 are annularly shaped; however, these shapes are changeable even when the corresponding source diffusion layers 32, 33 and the drain contact layer 52 are annular. Each of the source electrode film 40, the drain electrode film 54, the source diffusion layers 32, 33 and the drain contact layer 52 needs not always be annularly shaped, and would be sufficient to be looped.

(Fourth Embodiment)

Figure 15:
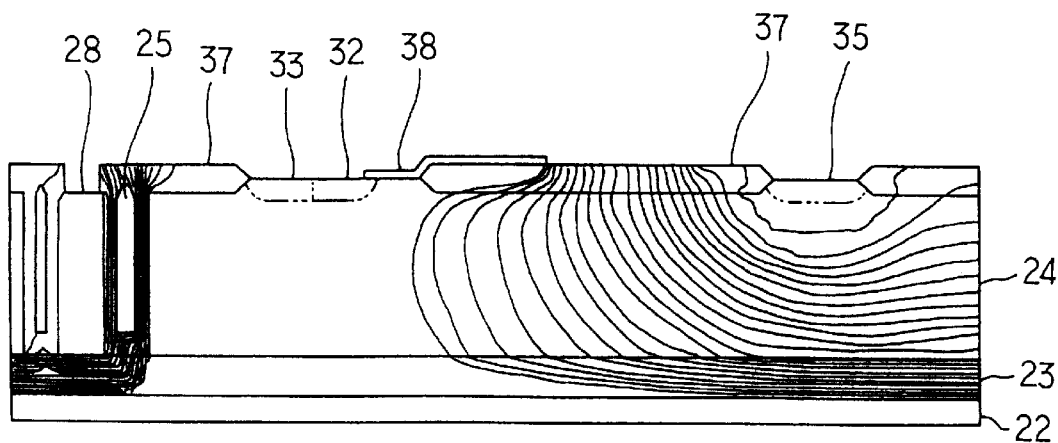
FIG. 15 is a characteristic view showing equipotential distribution in the LDMOS shown in FIG. 14.

FIGS. 14 and 15 shows a drain center type P channel LDMOS 451 in a fourth preferred embodiment. In FIG. 14, the same parts as those in FIG. 3 are indicated by the same reference numerals, and only points different from those will be explained.

In the first embodiment, the auxiliary electrode film 41 extending from the source electrode film 40 is provided over the trench 25. As opposed to this, in the fourth embodiment, the support substrate 22 is electrically connected to a power terminal +Vp through a connection wire 60 in stead of providing the auxiliary electrode film 41.

Accordingly, in the present embodiment, a positive voltage having a level substantially equal to that to the source diffusion layers 32, 33 is applied to the support substrate 22 through the connection wire 60. The voltage applied to the support substrate 22 needs not be always equal to that applied to the source diffusion layers 32, 33, and is sufficient to be a level capable of reducing a potential gradient between the support substrate 22 and the source diffusion layers 32, 33.

The constitution in the present embodiment can provide the following effects and features. FIG. 15 shows equipotential distribution curves obtained by a simulation in a state where a positive high voltage (210 V) is applied to the source electrode film 40 and the support substrate 22 and the buffer region 28 and the drain electrode film 42 are set to be the ground potential. As understood from FIG. 15, the applied voltage is divided into a component applied to a region between the source diffusion layers 32, 33 and the drain contact layer 35 (region including the electric field relaxation layer 29, the drift layer 30, the silicon oxide film 23, and the like), and a component applied to the trench 25 for isolation.

As a result, electric field is prevented from concentrating on the surface portion of the single crystal silicon layer 24 between the source diffusion layers 32, 33 and the trench 25. Even when a high voltage is applied across the source electrode film 40 and the drain electrode film 42, it becomes difficult to cause avalanche breakdown in the surface portion of the single crystal silicon layer 24 described above, resulting in improvement of a withstand voltage. That is, according to the fourth embodiment, the withstand voltage is sufficiently improved with a simple structure only additionally providing the connection wire 60 for applying voltage to the support substrate 22.

(Fifth Embodiment)

Figure 16:
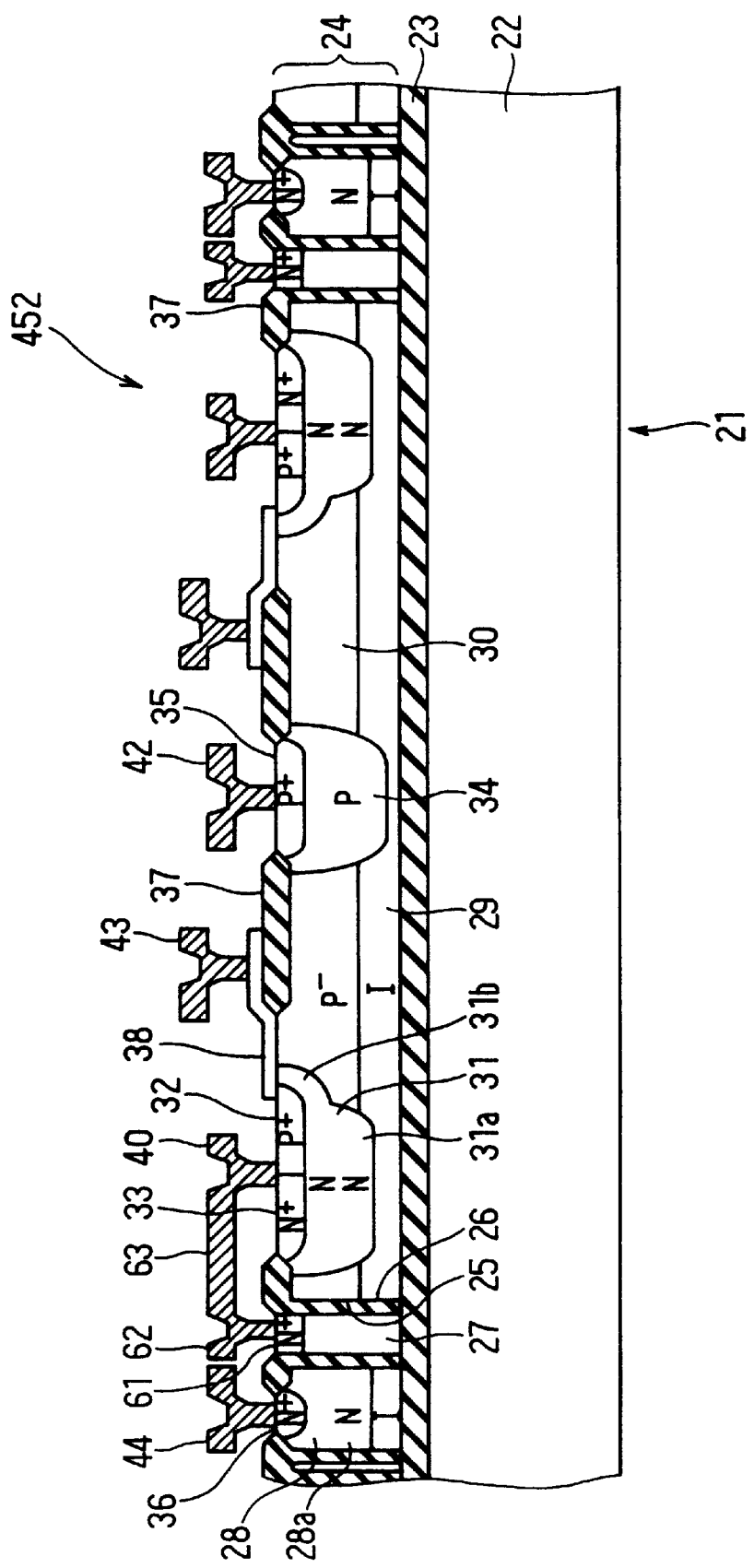
FIG. 16 is a cross-sectional view showing an LDMOS in a fifth preferred embodiment.

FIG. 16 shows a drain center type P channel LDMOS 452 in a fifth preferred embodiment. Only points different from those in the first embodiment will be explained.

In the fifth embodiment, the trench 25 for isolation is formed with an increased width, and a trench diffusion layer 61 is formed in a surface portion of the polysilicon 27 filling the trench 25 by implanting N type impurities with a high concentration (more than approximately $1.0 \times 10^{19}/cm^3$) to be surrounded by the silicon oxide film 26. A trench electrode film 62 is formed on the trench diffusion layer 61. Further, the trench electrode film 62 is connected to the source electrode film 40 via a connection wiring member 63 that is made of a material the same as that of the trench electrode film 62 and the source electrode film 40. Accordingly, in an practical operational state, a voltage is applied not only to the source diffusion layers 32, 33 but also to the trench diffusion layer 61 through the connection wiring member 63 and the trench electrode film 62.

Accordingly, potential gradient between the trench diffusion layer 61 and the source diffusion layers 32, 33 becomes small, so that the electric field concentration in the surface portion of the single crystal silicon layer 24 between the source diffusion layers 32, 33 and the trench 25 is relaxed similarly to the first embodiment, resulting in improvement of the withstand voltage.

Incidentally, impurities may be doped into the polysilicon 27 to decrease its value of resistance. Further, the same level voltage is applied to both the trench diffusion layer 61 and the source diffusion layer 32, 33 through the source electrode film 40, the connection wiring member 63, and the trench electrode film 62; however, the trench electrode film 62 and the source electrode film 40 may have individual connection members for independently applying voltages to the trench diffusion layer 61 and the source diffusion layers 32, 33 so that the potential gradient therebetween becomes small. The other features and effects are the same as those in the first embodiment.

(Sixth Embodiment)

Figure 17:
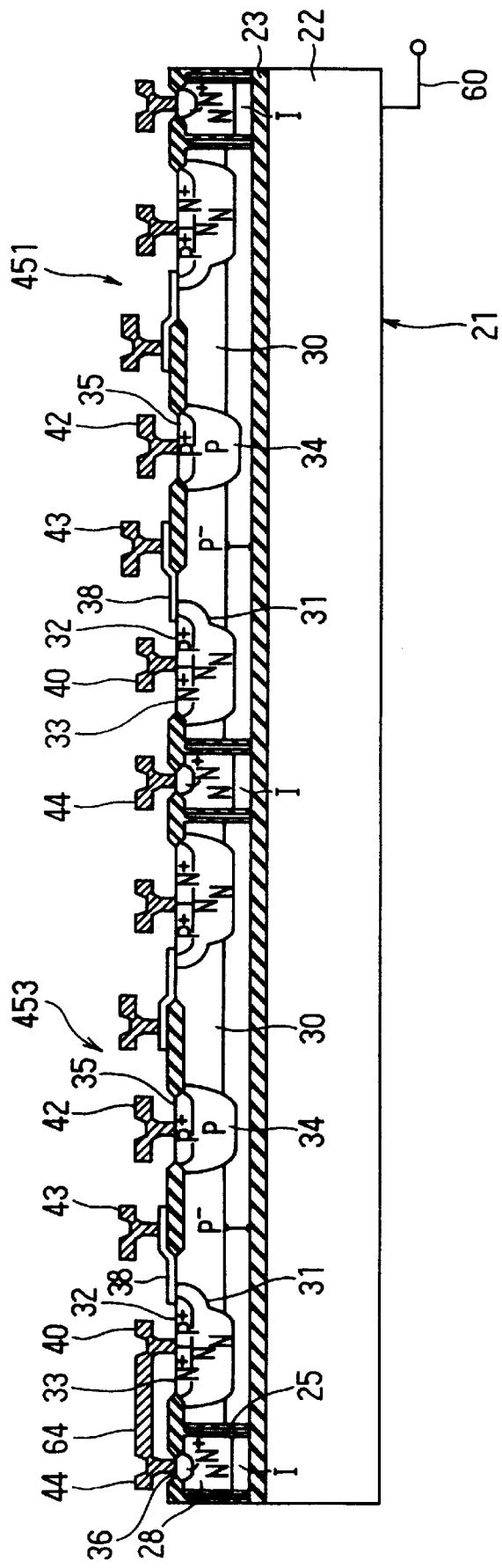
FIG. 17 is a cross-sectional view showing LDMOSes in a sixth preferred embodiment.

FIG. 17 shows drain center type P channel LDMOSes 453, 451 in a sixth preferred embodiment, and only points different from those in the first and fourth embodiment will be mainly explained.

In the sixth embodiment, the LDMOSes 453, 451 are provided on the identical SOI substrate 21. The same parts as those in FIGS. 3 and 14 are indicated by the same reference numerals. The LDMOS 451 has a structure substantially the same as that shown in FIG. 14 in the fourth embodiment. The LDMOSes 453, 451 can be used to supply electricity to a load. For instance, electricity can be supplied to the load from a positive power terminal through the LDMOS 453, and at the same time electricity can be supplied to the load from a negative power terminal through the LDMOS 451.

In the LDMOS 453, the source electrode film 40 and the buffer region electrode film 44 are connected to one another through a connection wiring member 64. Accordingly, a positive voltage applied to the source diffusion layers 32, 33 is simultaneously applied to the buffer region 28. In the LDMOS 451, a connection wire 60 is connected to the support substrate 22 to apply a voltage having the same level as that applied to the source diffusion layers 32, 33 as in the fourth embodiment.

According to the embodiment described above, in the LDMOS 453, a gate bias voltage is applied to the gate electrode film 43 in a state where a positive voltage is applied to the source diffusion layers 32, 33 through the source electrode film 40, and a ground potential level voltage is applied to the drain contact layer 35 through the drain electrode film 42. Accordingly, a current having a magnitude corresponding to the gate bias voltage flows between the source diffusion layers 32, 33 and the drain contact layer 35. In this case, since the voltage applied to the source diffusion layers 32, 33 is applied to the buffer region 28 through the connection wiring member 64 and the buffer region electrode film 44, potential gradient between the buffer region 28 and the source diffusion layers 32, 33 is decreased, resulting in improvement of a withstand voltage as in the first embodiment.

On the other hand, in the LDMOS 451, a gate bias voltage is applied to the gate electrode film 43 in a state where the ground potential level voltage is applied to the source diffusion layers 32, 33 through the source electrode film 40 and a negative voltage is applied to the drain contact layer 35 through the drain electrode film 42. Accordingly, current having a magnitude corresponding to the gate bias voltage flows between the source diffusion layers 32, 33 and the drain contact layer 35. In this case, since a voltage having a level equal to that (ground potential level) of the voltage applied to the source diffusion layers 32, 33 is applied to the support substrate 22 through the connection wire 60, the potential gradient between the support substrate 22 and the source diffusion layers 32, 33 is decreased, resulting in improvement of a withstand voltage as in the fourth embodiment.

Incidentally, when the positive and negative power terminals are utilized as described above, a potential difference between the drain electrode film 42 and the support substrate 22 should be controlled not to be two times larger than a power voltage. Therefore, the voltage applied to the support substrate 22 is determined in consideration of this point.

(Seventh Embodiment)

Figure 18:
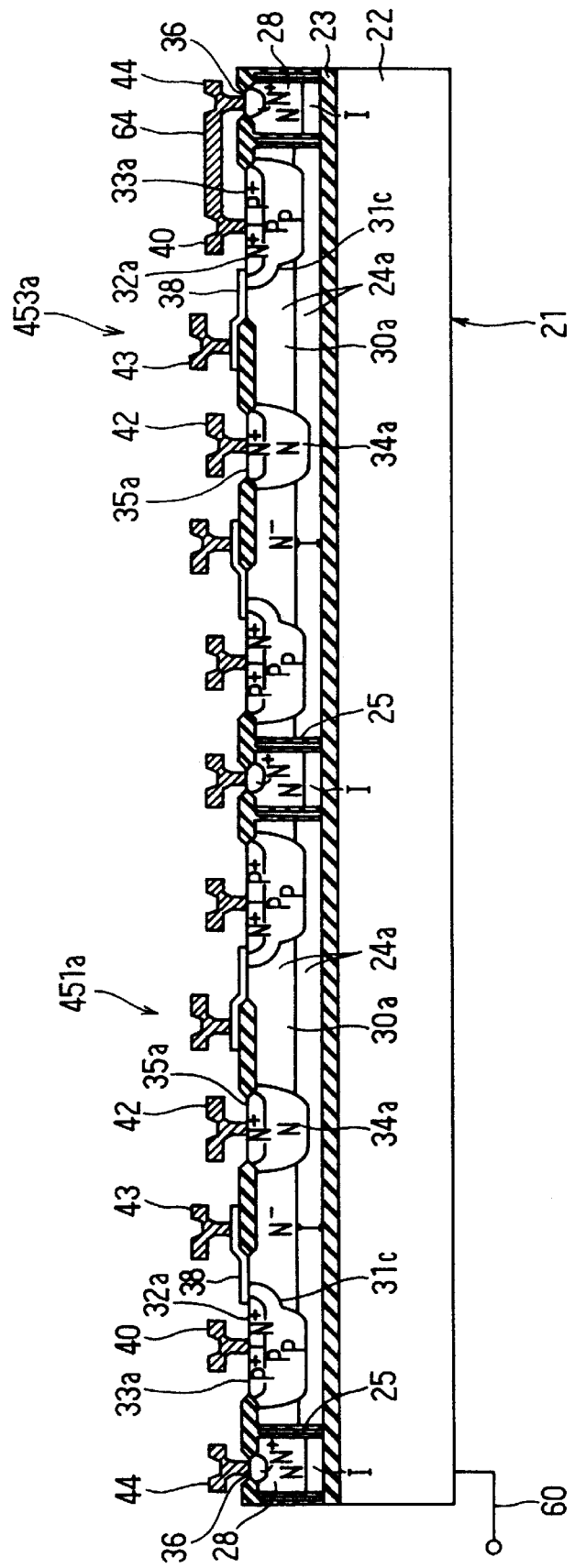
FIG. 18 is a cross sectional view showing LDMOSes in a seventh preferred embodiment.

FIG. 18 shows N channel LDMOSes 451a, 453a in a seventh preferred embodiment, and only points different from the embodiments described above will be mainly explained.

In the seventh embodiment, the N channel LDMOSes 451a, 453a are provided on the identical SOI substrate 21. Accordingly, electricity can be supplied to a load from a positive power terminal through the LDMOS 451a, and at the same time electricity can be supplied to the load from a negative power terminal through the LDMOS 453a.

In the LDMOSes 451a, 453a, parts constituting drain, source, and the like have reverse conductive types relative to those in FIGS. 14 and 17. The arrangements of the LDMOSes 451a, 453a are substantially the same as those of the LDMOSes 451, 453, respectively, except for the conductive types. Specifically, in the LDMOSes 451a, 453a, the drift layer 30a is made of an N⁻ diffusion layer, and the double well 31c is P type. The source diffusion layer 32a is made of an N⁺ diffusion layer, the source diffusion layer 33a is made of a P⁺ diffusion layer, the deep drain region 34a is composed of an N well, and the drain contact layer 35a is made of an N⁺ diffusion layer. The other features are the same as those of the LDMOSes 451, 453.

In the LDMOS 451a, the connection wire 60 is connected to the support substrate 22 to apply voltage having a level substantially the same as that to the source diffusion layers 32, 33. In the LDMOS 453a, the connection wiring member 64 connects the source electrode film 40 and the buffer region electrode film 44 as in the sixth embodiment.

According to the seventh embodiment, in the LDMOS 451a, a gate bias voltage is applied to the gate electrode film 43 in a state where a ground potential level voltage is applied to the source diffusion layers 32a, 33a through the source electrode film 40, and a positive voltage is applied to the drain contact layer 35a through the drain electrode film 42. In this case, since the voltage having the same level (ground potential level) as that applied to the source diffusion layers 32a, 33a is applied to the support substrate 22 through the connection wire 60, the potential gradient between the support substrate 22 and the source diffusion layers 32a, 33a is decreased, resulting in improvement of the withstand voltage.

On the other hand, in the LDMOS 453a, a gate bias voltage is applied to the gate electrode film 43 in a state where a negative voltage is applied to the source diffusion layers 32a, 33a through the source electrode film 40 and the ground potential level voltage is applied to the drain contact layer 35a through the drain electrode film 42. In this case, since the voltage applied to the source diffusion layers 32a, 33a is simultaneously applied to the buffer region 28 through the connection wiring member 64 and the buffer region electrode film 44, the potential gradient between the buffer region 28 and the source diffusion layers 32a, 33a is decreased, resulting in improvement of the withstand voltage.

(Eighth Embodiment)

Figure 19:
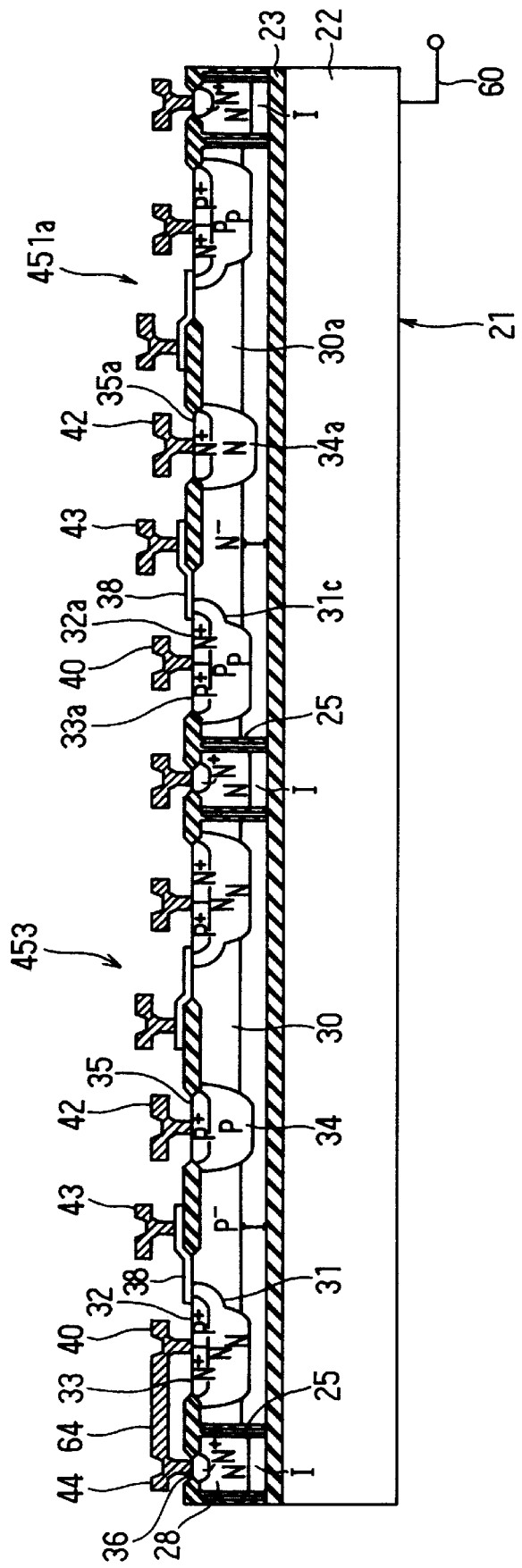
FIG. 19 is a cross-sectional view showing LDMOSes in an eighth preferred embodiment.

FIG. 19 shows LDMOSes 453, 451a in an eighth preferred embodiment, which are provided on the identical SOI substrate 21. The structure of the LDMOS 453 is substantially the same as that of the LDMOS 453 shown in FIG. 17, and the structure of the LDMOS 451a is substantially the same as that of the LDMOS 451a shown in FIG. 18.

In the LDMOS 453, a gate bias voltage is applied to the gate electrode film 43 in a state where a positive voltage is applied to the source diffusion layers 32, 33 through the source electrode film 40, and a ground potential level voltage is applied to the drain contact layer 35 through the drain electrode film 42. In this case, the voltage applied to the source diffusion layers 32, 33 is applied to the buffer region 28 through the connection wiring member 64, resulting in decreased potential gradient between the buffer region 28 and the source diffusion layers 32, 33.

On the other hand, in the LDMOS 451a, a gate bias voltage is applied to the gate electrode film 43 in a state where a ground potential level voltage is applied to the source diffusion layers 32a, 33a through the source electrode film 40, and a positive voltage is applied to the drain contact layer 35a through the drain electrode film 42. At the same time, a voltage having a level substantially the same as that (ground potential level) applied to the source diffusion layers 32a, 33a is applied to the support substrate 22 through the connection wire 60. As a result, potential gradient between the support substrate 22 and the source diffusion layers 32a, 33a is decreased. Consequently, the withstand voltage is improved.

(Ninth Embodiment)

Figure 20:
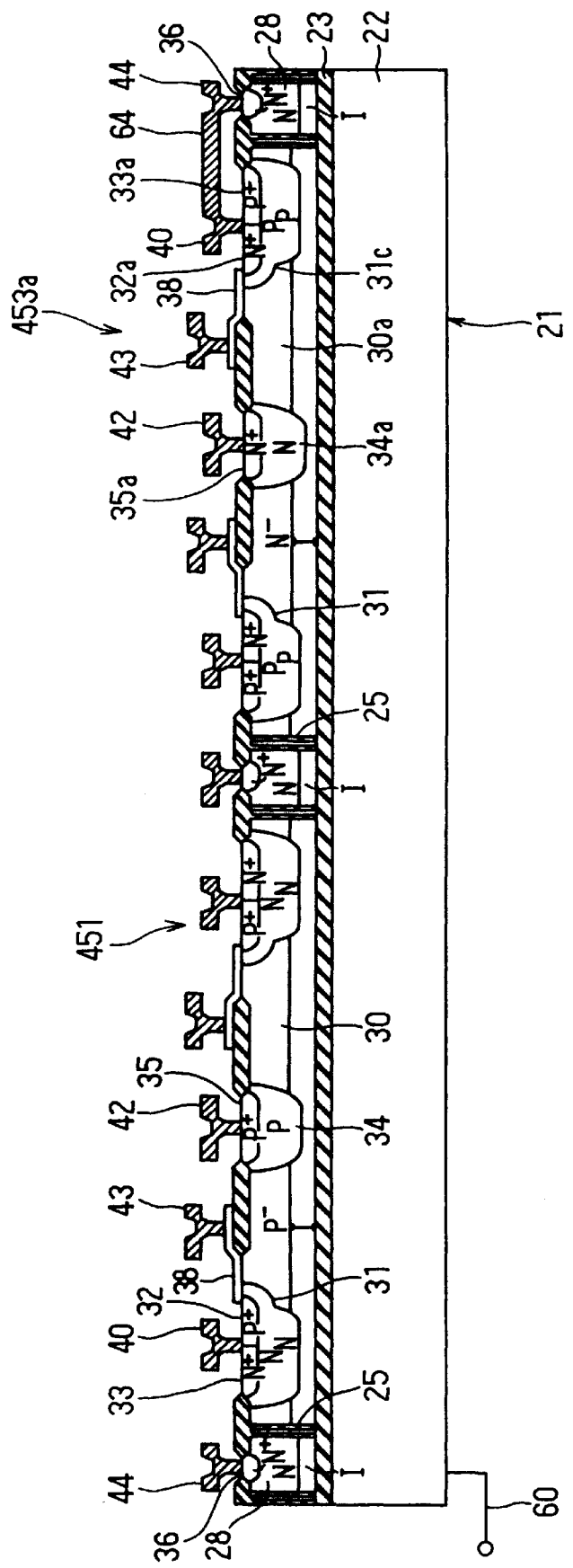
FIG. 20 is a cross-sectional view showing LDMOSes in a ninth preferred embodiment.

FIG. 20 shows LDMOSes 451, 453a in a ninth preferred embodiment, which are provided on the identical SOI substrate 21. The structure of the LDMOS 451 is substantially the same as that of the LDMOS 451 shown in FIG. 14, and the structure of the LDMOS 453a is substantially the same as that of the LDMOS 453a shown in FIG. 18.

In an operational state, for instance, in the LDMOS 451, a positive voltage is applied to the source electrode film 40, a ground potential level voltage is applied to the drain electrode film 42, and a positive voltage is applied to the support substrate 22 through the connection wire 60. On the other hand, in the LDMOS 453a, the ground potential level voltage is applied not only to the source electrode film 40 but also to the buffer region 28, and a positive voltage is applied to the drain electrode film 42. In this embodiment, the withstand voltage is improved as well.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A semiconductor apparatus comprising:

a support substrate;

an insulation layer provided on the support substrate;

a semiconductor layer provided on the insulation layer and including a first element formation region and a second element formation region as an island region that is surrounded by a trench region to be electrically isolated from the first element formation region;

a buffer region surrounding the island region for preventing an electrical interference between the island region and the first element formation region;

a source region and a drain region provided in the island region, a first one of the source region and the drain region being looped around a second one of the source region and the drain region;

a source electrode and a drain electrode respectively provided on the source region and the drain region, a first one of the source electrode and the drain electrode connected to the first one of the source region and the drain region, and extending between the trench region and a second one of the source electrode and the drain electrode; and a gate electrode provided over a portion of the island region between the source region and the drain region, wherein when a first voltage having a specific polarity is applied to the first one of the source electrode and the drain electrode, a second voltage having the specific polarity is applied to one of a specific portion of the island region, the trench region, and the support substrate, the specific portion of the island region extending between the trench region and the first one of the source electrode and the drain electrode.

2. The semiconductor apparatus of claim 1, further comprising an auxiliary electrode provided on the specific portion between the trench region and the first one of the source electrode and the drain electrode, for receiving the second voltage.

3. The semiconductor apparatus of claim 2, wherein the auxiliary electrode is electrically connected to the first one of the source electrode and the drain electrode.

4. The semiconductor apparatus of claim 2, wherein the auxiliary electrode extends over the trench region.

5. The semiconductor apparatus of claim 2, wherein:

the trench region is filled with a trench region semiconductor layer at least at a surface portion thereof; and the auxiliary electrode is electrically connected to the trench region semiconductor layer.

6. The semiconductor apparatus of claim 2, wherein the auxiliary electrode is looped to correspond to a shape of the trench region.

7. The semiconductor apparatus of claim 1, wherein the specific polarity of the first voltage and the second voltage is positive.

8. The semiconductor apparatus of claim 1, wherein the first voltage and the second voltage are a ground level.

9. A semiconductor apparatus comprising:

a semiconductor substrate including a first element formation region and a second element formation region as an island region that is surrounded by a trench region, the trench region electrically isolating the island region from the first element formation region;

a buffer region surrounding the trench region for preventing an electrical interference between the island region and the first element formation region;

a source region and a drain region provided in the island region, a first one of the source region and the drain region being looped to be concentrically provided around a second one of the source region and the drain region;

a source electrode and a drain electrode respectively provided on the source region and the drain region, a first one of the source electrode and the drain electrode connected to the first one of the source region and the drain region, and extending adjacently to the trench region more than a second one of the source electrode and the drain electrode;

a gate electrode provided over a portion of the island region between the source region and the drain region; and an auxiliary electrode provided between the trench region and the first one of the source electrode and the drain electrode, wherein when a first voltage having a specific polarity is applied to the first one of the source electrode and the drain electrode, a second voltage having the specific polarity is applied to the auxiliary electrode.

10. The semiconductor apparatus of claim 9, wherein the auxiliary electrode is looped to correspond to a shape of the trench region.

11. The semiconductor apparatus of claim 9, wherein the auxiliary electrode is electrically connected to the first one of the source electrode and the drain electrode.

12. The semiconductor apparatus of claim 9, wherein the first one of the source electrode and the drain electrode are looped to correspond to a shape of the first one of the source region and the drain region.

13. The semiconductor apparatus of claim 9, wherein the auxiliary electrode is disposed over the trench region.

14. The semiconductor apparatus of claim 9, wherein the auxiliary electrode is independent from the first one of the source electrode and the drain electrode.

15. The semiconductor apparatus of claim 9, wherein:

the trench region is filled with a trench region semiconductor layer at least at a surface portion thereof; and the auxiliary electrode is electrically connected to the trench region semiconductor layer.

16. The semiconductor apparatus of claim 15, wherein the auxiliary electrode is electrically connected to the first one of the source electrode and the drain electrode.

17. The semiconductor apparatus of claim 9, wherein the first and second voltages are positive, and the buffer region is grounded.

18. The semiconductor apparatus of claim 9, wherein:

the semiconductor substrate includes;

a support substrate;

an insulation layer provided on the support substrate; and a semiconductor layer provided on the insulation layer and having the first element formation region and the second element formation region, and a third voltage is applied to the support substrate so that a potential difference between the support substrate and the first one of the source region and the drain region is decreased.

19. A semiconductor apparatus comprising:

a support substrate;

an insulation layer provided on the support substrate;

a semiconductor layer provided on the insulation layer and including a first island region and a second island region respectively surrounded by a first trench region and a second trench region to be electrically isolated from one another;

a first semiconductor element provided in the first island region and including:
- a first source region and a first drain region provided in the first island region, a first one of the first source region and the first drain region being looped around a second one of the first source region and the first drain region;
- a first source electrode and a first drain electrode respectively provided on the first source region and the first drain region; and
- a first gate electrode provided over a portion of the first island region between the first source region and the first drain region; and support substrate connection means electrically connected to the support substrate for applying a voltage to the support substrate so that a potential difference between the support substrate and the first one of the first source region and the first drain region becomes small.

20. The semiconductor apparatus of claim 19, further comprising:

a second semiconductor element provided in the second island region and including:
- a second source region and a second drain region provided in the second island region, a first one of the second source region and the second drain region being looped around a second one of the second source region and the second drain region;
- a second source electrode and a second drain electrode respectively provided on the second source region and the second drain region; and
- a second gate electrode provided over a portion of the second island region between the second source region and the second drain region;

a buffer region surrounding the second island region for preventing an electrical interference between the first semiconductor element provided in the first island region and the second semiconductor element provided in the second island region; and buffer region connection means electrically connected to the buffer region for applying a voltage to the buffer region so that a potential difference between the buffer region and the first one of the second source region and the second drain region becomes small.

21. The semiconductor apparatus of claim 20, wherein a first one of the first semiconductor element and the second semiconductor element is a P channel MOSFET, and a second one of the first semiconductor element and the second semiconductor element is an N channel MOSFET.

* * * * *